(12) United States Patent
Hata et al.

(10) Patent No.: US 6,720,584 B2
(45) Date of Patent: Apr. 13, 2004

(54) NITRIDE TYPE COMPOUND SEMICONDUCTOR LIGHT EMITTING ELEMENT

(75) Inventors: Toshio Hata, Nara (JP); Mayuko Fudeta, Nara (JP); Daigaku Kimura, Tenri (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

(21) Appl. No.: 10/004,913

(22) Filed: Dec. 3, 2001

(65) Prior Publication Data

US 2002/0074558 A1 Jun. 20, 2002

(30) Foreign Application Priority Data

Dec. 4, 2000 (JP) ......................... 2000-367882

(51) Int. Cl.[7] .................... H01L 27/15; H01L 33/00
(52) U.S. Cl. .................. 257/98; 257/79; 257/102; 257/103
(58) Field of Search ............... ; 313/500, 502, 313/506; 257/94, 98, 97; 349/62, 69, 70, 71; H01L 33/00

(56) References Cited

U.S. PATENT DOCUMENTS 3,603,830 A * 9/1971 Gallaro et al. ............ 252/512
5,756,147 A * 5/1998 Wu et al. ................ 427/126.2
5,926,239 A * 7/1999 Kumar et al. ............... 349/69
6,069,439 A * 5/2000 Matsuda et al. ........... 313/461
6,072,198 A * 6/2000 Sun et al. .................. 257/102
6,340,824 B1 * 1/2002 Komoto et al. .............. 257/99
6,373,188 B1 * 4/2002 Johnson et al. .............. 257/94
6,504,181 B2 * 1/2003 Furukawa et al. ............ 257/98

FOREIGN PATENT DOCUMENTS

| JP | 07099345 A | 11/1995 | |
| JP | 11-330547 | * 11/1999 | ........... H01L/33/00 |
| WO | WO 97/48138 | * 12/1997 | ........... H01L/33/00 |

* cited by examiner

Primary Examiner—Carl Whitehead, Jr.
Assistant Examiner—David L. Hogans

(74) Attorney, Agent, or Firm—Morrison & Foerster LLP

(57) ABSTRACT

In a nitride type compound semiconductor light emitting element, a phosphor layer is formed in a multilayer constituting the light emitting element. A highly-reflective layer is formed at a side plane of the light emitting element. The nitride type compound semiconductor light emitting element can emit white light or multi-colored light, and is superior in mass production and reliability. The wavelength of the emitted light can be converted into a different wavelength by the light emitting element alone.

15 Claims, 18 Drawing Sheets

NITRIDE TYPE COMPOUND SEMICONDUCTOR LIGHT EMITTING ELEMENT

BACKGROUND OF THE INVENTION

1. Field of the Invention

The present invention relates to a nitride type compound semiconductor light emitting element (laser and light emitting diode) that can produce light emission in the region from blue light to ultraviolet. In particular, the present invention relates to a white light or multi-color light emitting element having a phosphor formed in a nitride type compound semiconductor light emitting element.

2. Description of the Background Art

As a conventional example of a light emitting diode, FIG. 18 shows a structure of a nitride gallium type compound semiconductor light emitting element 400 converting the wavelength of light from a light emitting layer to obtain light differing in wavelength from the light emitting wavelength. A light emitting chip 100 is disposed at a bottom 300 of a cup. A mold resin 200 including a wavelength converting material (fluorescent material) is formed around light emitting chip 100. The wavelength of the light emitted from light emitting chip 100 is converted. Such a light emitting diode is disclosed in, for example, Japanese Patent Laying-Open No. 7-99345.

The above conventional light emitting diode had problems set forth below. When a wavelength converting material (fluorescent material) is included in the mold resin, there is a change in the optical characteristics due to the fluorescent material being provided unevenly in the mold resin. There was also a significant variation in the characteristics if the amount of the mold resin slightly changes. The conventional light emitting chip could not convert the wavelength of the emitted light into a different wavelength unless a mold resin containing fluorescent material was formed at the outer side or around the light emitting chip. There was a problem that the wavelength of the emitted light could not be converted into a different wavelength by the light emitting chip per se.

SUMMARY OF THE INVENTION

An object of the present invention is to provide a nitride type compound semiconductor light emitting element having the aforementioned problem solved.

According to an aspect of the present invention, a nitride type compound semiconductor light emitting element has a multilayer structure including a substrate, a nitride gallium type compound semiconductor layer of a first conductivity type, a nitride gallium type compound semiconductor light emitting layer, and a nitride gallium type compound semiconductor layer of a second conductivity type. In the nitride type compound semiconductor light emitting element, a phosphor is provided in the multilayer structure or at a portion of the substrate. This allows the emitted light to be converted in wavelength by the light emitting diode alone.

In the nitride type compound semiconductor light emitting element of the present invention, the phosphor is coated with a transparent conductor film at its surface.

In the nitride type compound semiconductor light emitting element of the present invention, the phosphor is formed below the nitride gallium type compound semiconductor light emitting layer.

In the nitride type compound semiconductor light emitting element of the present invention, the phosphor is formed in the substrate.

In the nitride type compound semiconductor light emitting element of the present invention, the phosphor is formed at at least two sites in the direction where the layers are stacked.

In the nitride type compound semiconductor light emitting element of the present invention, the multilayer structure has a highly-reflective layer formed at at least one side.

In the nitride type compound semiconductor light emitting element of the present invention, the highly-reflective layer is also formed at opposite sides.

In the nitride type compound semiconductor light emitting element of the present invention, the highly-reflective layer is also formed at the bottom plane of the substrate.

In the nitride type compound semiconductor light emitting element of the present invention, the phosphor is formed of at least two types of phosphors.

In the nitride type compound semiconductor light emitting element of the present invention, the transparent conductor film is formed of at least one of $In_2O_3$, $SnO_2$ and ZnO, or a mixture thereof The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
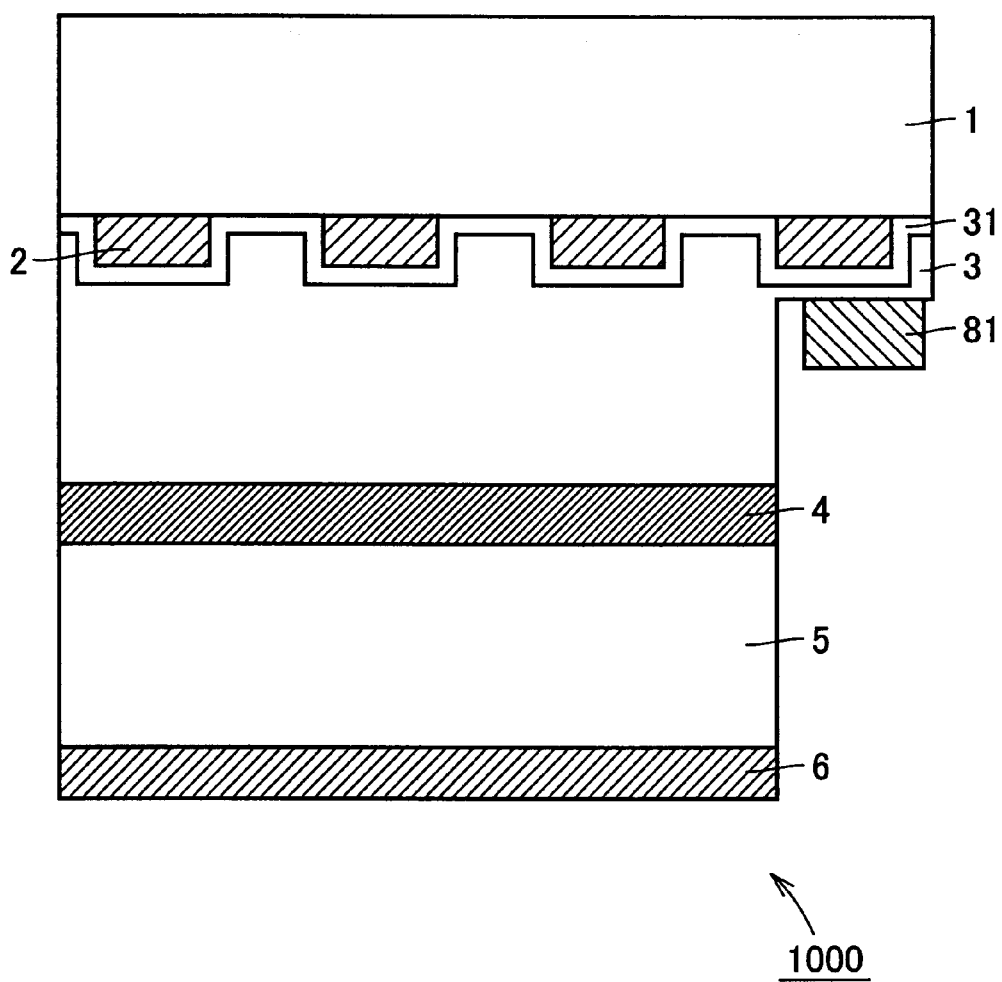
FIGS. 1, 2, 3 and 4 are schematic diagrams of a nitride gallium type compound semiconductor light emitting element according to first, second, third and fourth embodiments, respectively.

Specific embodiments of the present invention will be described in detail hereinafter. In the present specification, it is assumed that a nitride gallium type semiconductor includes, for example, $In_xAl_yGa_{1-x-y}N$ ($0 \leq x$, $0 \leq y$, $x+y \leq 1$).

According to the embodiment of the present invention, a nitride type compound semiconductor light emitting element is produced that can convert the wavelength of the emitted light into a different wavelength with the light emitting element alone by having a phosphor layer formed in a multilayer that forms the light emitting element.

In the nitride type compound semiconductor light emitting element, the wavelength of the emitted light can be converted more efficiently by having a phosphor layer formed in multi-stages within the substrate. By forming the phosphor layer in multi-stages within the substrate and regrowing the phosphor layer as a selective growth mask, a thick conductive substrate can be formed. Since the multi-stage phosphor layer in the substrate is formed of at least one type, multi-colored light can be emitted by the excitation of the light from the light emitting layer. In the present invention, the substrate is preferably a substrate of sapphire, GaN, SiC, ZnO and Si. Further preferably, a transparent substrate of sapphire, GaN, SiC, ZnO and the like is employed. The phosphor is preferably located between the light emitting layer and light output plane for an Si substrate. For a transparent substrate, the phosphor is preferably located between the light emitting layer and the substrate, or in the substrate.

A typical phosphor layer is generally non-conductive. By applying a transparent conductor film on the phosphor layer, a transparent conductor will be introduced between the phosphors forming the phosphor layer during the application of a transparent conductor film. Accordingly, a conductive phosphor layer is provided. There is an advantage that the series resistance of the light emitting diode is not increased even if the conductive phosphor layer is formed in the multilayer or in the substrate. Since the surface of a typical phosphor layer is uneven, it is difficult to directly grow a nitride type semiconductor layer on the phosphor layer. The application of a transparent conductor film on the phosphor layer allows planarization of the surface of the phosphor layer. Therefore, there is an advantage that a nitride type semiconductor layer can be grown by lateral growth taking advantage of the transparent conductor film. It is also preferable to coat the phosphor layer with a transparent conductor film since the conversion efficiency of the phosphor will not be degraded by virtue of the transparent conductor film being transparent in the ultraviolet region.

The transparent conductor film includes at least one $In_2O_3$, $SnO_2$, $ZnO$, $Cd_2SnO_4$, and $CdSnO_3$. In the case of $In_2O_3$, one of Sn, W, Mo, Zr, Ti, Sb, F and the like is employed as the dopant. In the case of $SnO_2$, one of Sb, P, Te, W, Cl, F and the like is selected as the dopant. In the case of $Cd_2SnO_4$, Ta is employed as the dopant. In the case of ZnO, one of Al, In, B, F and the like is employed.

Suitable fluorescent materials are enumerated hereinafter. As a phosphor emitting red light, ZnS: Cu, $LiAlO_2$: $Fe^{3+}$, $Al_2O_3$: Cr, $Y_2O_3$: $EU^{3+}$, Y (P, V) $O_4$: $Eu^{3+}$, $Y_2O_3$: Eu phosphor, and a mixture of $Y_2O_3$: Eu phosphor and $Y_2O_3S$: Eu phosphor are employed. As a phosphor emitting orange light, ZnS: Cu, Mn, (Zn, Cd)S: Ag, ZnS: Mn and (Sr, Mg, Ba)$_3$(PO$_4$)$_2$ are employed. As a phosphor emitting green light, ZnS: Cu, Al, $LaPO_4$: $Ce^{3+}$, $Tb^{3+}$, Sr(S, Se): Sm, Ce, $ZnSiO_4$: $Mn^{2+}$, βZnS: Cu, ZnS: Cu, Fe (Co), ZnS: PbZnS: Cu phosphor, and a mixture of ZnS: Cu, Al phosphor and $Y_2Al_5O_{12}$: Tb phosphor are employed. As a phosphor emitting blue light, CaS: Bi, (Sr, Ca)$_{10}$(PO$_4$)$_6$Cl$_2$: $Eu^{2+}$, SrS: Sm, Ce, $Sr_2P_2O_7$: $Eu^{2+}$, βZnS: Ag, (Ba, Ca, Mg)$_{10}$ (PO$_4$)$_6$Cl$_2$: $Eu^{2+}$, and $3Sr_3$ (PO$_4$)$_2$.CaCl$_2$: $Eu^{2+}$ phosphor are employed. As a phosphor emitting white light, ZnO: Zn, ZnS: AsZnS: Au, Ag, Al, $Ca_2P_2O_7$: Dy, $Ca_3(PO_4)_2$.CaF$_2$: Sb, $3Ca_3(PO_4)_2$.Ca(F, Cl)$_2$: $Sb^{3+}$, $3Ca_3(PO_4)_2$.Ca(F, Cl)$_2$: $Sb^{3+}$, $Mn^{2+}$, and $MgWO_4$ phosphor are employed.

The formation of a highly reflective layer at opposite sides of the light emitting element allows efficient excitation of the phosphor layer during the multiple reflection of the light generated from the light emitting layer at the highly-reflective layer. Therefore, the emitted light can be converted efficiently in wavelength.

By applying current in a concentrated manner into the light emitting layer, the power of the excited light introduced into the phosphor layer can be increased. Also, the excited light can be introduced efficiently into the region where the phosphor layer is formed.

The highly-reflective layer may be formed at only one of the opposite sides. In this case, it is preferable to set the side opposite the highly-reflective layer as the light output plane. This allows the configuration of a side light emitting diode that can utilize light emitted at the side. Such an element is effective as, for example, a compact liquid crystal backlight such as of a cellular phone.

With regards to the highly-reflective layer, an insulator multilayer film, for example, preferably employs $Al_2O_3$, $TiO_2$, $HfO_2$, TiO, $CeF_3$, $CeO_2$, MgO, $Nd_2O_3$, $NdF_3$, PbO, $Pr_6O_{11}$, $Sc_2O_3$, $Y_2O_3$, $ZrO_2$ and the like as the material of high refraction factor and employs $SiO_2$, $Si_2O_3$, $CaF_3$, $MgF_2$, $LaF_3$, LiF, $MgF_2$, NaF and the like as the material of low refraction factor.

The electrode is formed using Au (gold), Ni (nickel), Pt (platinum), Pd (palladium), Al (aluminum), Ti (titanium), or Hf (hafnium) through the vacuum deposition method, electron beam vapor deposition, and the like.

The transparent conductor film that covers the phosphor is formed by vapor deposition, sputtering, CVD and the like.

The structure of the nitride gallium type compound semiconductor light emitting element was described for a light emitting element of the homo structure. However, any structure such as the quantum well structure can be applied to the double hetero structure, single hetero structure, and the active layer as long as a nitride gallium type compound semiconductor light emitting element is employed. Here, the nitride gallium type compound semiconductor light emitting element includes a light emitting diode (LED) or a semiconductor laser (LD).

EXAMPLE 1

FIG. 1 is a schematic diagram of a nitride type compound semiconductor light emitting element produced according to an example of the present invention.

An element structure 1000 of the present invention includes, on a sapphire substrate 1, a buffer layer 31, an N type nitride gallium type compound semiconductor layer 3, a nitride gallium type compound semiconductor light emitting layer 4, a P type nitride gallium type compound semiconductor layer 5, a P type thick-film electrode 6 thereon, and an N type pad electrode 81 on N type nitride gallium type compound semiconductor layer 3. Element structure 1000 is characterized in that a phosphor layer 2 coated with a transparent conductor film is provided between N type nitride gallium type compound semiconductor layer 3 and sapphire substrate 1.

The fabrication steps of element structure 1000 of the present invention will be described in further detail.

(1) Powder of phosphor and polyvinyl alcohol were mixed. Then, a slight amount of bichromate was added and dispersed. This mixture was spin-coated all over sapphire substrate 1. A mask pattern was formed thereon, followed by ultraviolet exposure to solidify only the portion of the phosphor layer that is to be left. The portions not necessary were removed with an organic solvent. Then, a transparent conductor film was applied on the phosphor layer. The transparent conductor film was formed of $In_2O_3$ with Sn as the dopant. The width and height of the phosphor layer were 50 $\mu$m and 2 $\mu$m, respectively. The distance between adjacent phosphor layers was 10 $\mu$m. The thickness of the transparent conductor film formed on the phosphor layer was 0.5 $\mu$m. The transparent conductor film was formed to cover phosphor layer 2. The general photo-etching step was employed to remove the transparent conductor film in stripes using an iron chloride type solution. Thus, a phosphor layer 2 was formed on sapphire substrate 1, coated with a transparent conductor film in stripes.

As the coated phosphor layer 2, $3Ca_3(PO_4)_2 \cdot Ca(F, Cl)_2$: $Sb^{3+}$, $Mn^{2+}$ phosphor was employed. Alternatively, a YAG type phosphor such as $(Y, Gd)_3(Al, Ga)_5O_{12}$: Ce and the like can be used.

(2) Then, buffer layer 31, N type nitride gallium type compound semiconductor layer 3, nitride gallium type compound semiconductor light emitting layer 4, and P type nitride gallium type compound semiconductor layer 5 were sequentially layered on phosphor layer 2 coated with the transparent conductor film.

(3) A resist (not shown) was formed as a mask for dry etching on the multilayer. Dry etching was applied until N type nitride gallium type compound semiconductor layer 3 was exposed, whereby a light emitting region was formed. Then, N type pad electrode 31 was formed at the surface of N type nitride gallium type compound semiconductor layer 3. N type pad electrode 81 was of a multilayer structure of Al (thickness 300 nm) and Ti (thickness 20 nm). 7 nm-thick Pd and 20 nm-thick Ag were formed as P type thick-film electrode 6 on P type nitride gallium type compound semiconductor layer 5. The sapphire substrate 1 wafer was diced into chips of 500 $\mu$m square. P type thick-film electrode 6 is disposed at the bottom of the cup. In order to provide electrical contact between N type pad electrode 81 and an external source, an Au wire was connected onto N type pad electrode 81. P type thick-film electrode 6 functions as a highly-reflective layer. The light towards P type nitride gallium type compound semiconductor layer 5 is reflected upwards efficiently to cause light to enter phosphor layer 2 coated with the transparent conductor film. Therefore, the conversion efficiency of the wavelength of the emitted light is improved.

By forming phosphor layer 2 between sapphire substrate 1 and N type nitride gallium type compound semiconductor layer 3, a phosphor layer is formed within the multilayer that constitutes the light emitting element. Thus, a nitride type compound semiconductor light emitting element that can convert the wavelength of the emitted light by the light emitting element alone is provided. The produced nitride gallium type compound semiconductor light emitting element that can emit white light is superior in light emitting efficiency and mass production. The wavelength of the light emitted from this light emitting element exhibited the two peaks of 480 nm and 570 nm. A similar effect can be provided by forming phosphor layer 2 within substrate 1 instead of the above-described case where phosphor layer 2 was formed on substrate 1.

EXAMPLE 2

Figure 2:
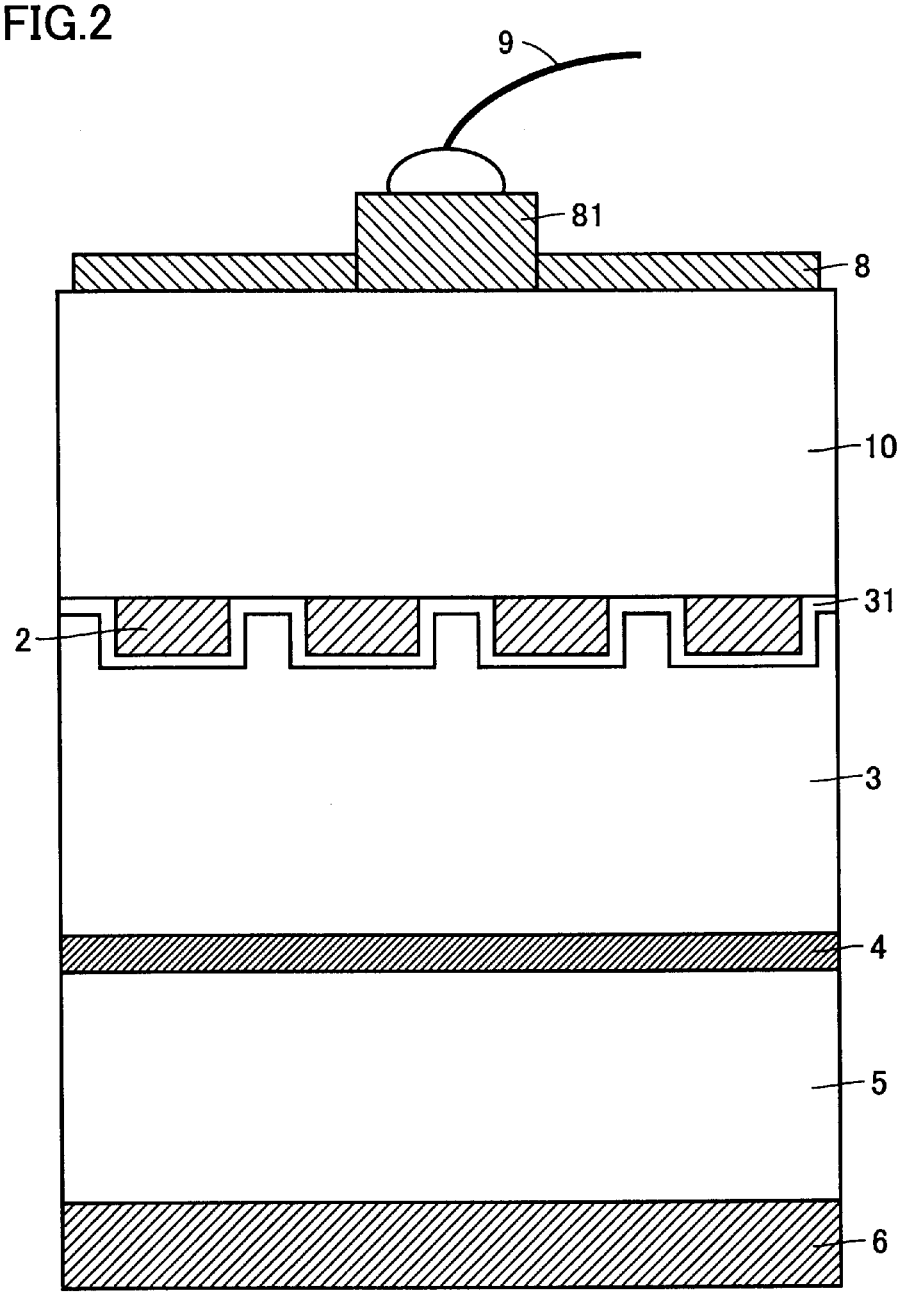

FIG. 2 is a schematic diagram of a nitride type compound semiconductor light emitting element fabricated according to another example.

An element structure 2000 of the present example includes, on a GaN substrate 10, an N type nitride gallium type compound semiconductor buffer layer 31, an N type nitride gallium type compound semiconductor layer 3, a nitride gallium type compound semiconductor light emitting layer 4, a P type nitride gallium type compound semiconductor layer 5, a P type thick-film electrode 6 thereon, an N type electrode 8 at the back side of GaN substrate 10, and an Au bonding wire 9 on N type electrode 81. Element structure 2000 is characterized in that a phosphor layer 2 coated with a transparent conductor film is formed between N type nitride gallium type compound semiconductor buffer layer 31 and GaN substrate 10.

The fabrication step of the present example will be described in further detail.

(1) By a process similar to that of Example 1, a phosphor layer 2 coated with a transparent conductor film was formed on GaN substrate 10. Here, the width and height of phosphor layer 2 was 40 $\mu$m and 2 $\mu$m, respectively. The distance between adjacent phosphor layers was 8 $\mu$m. The thickness of the transparent conductor film on phosphor layer 2 was 0.5 $\mu$m. The transparent conductor film was formed to cover phosphor layer 2. Materials similar to those of Example 1 can be employed for phosphor layer 2.

(2) Then, N type nitride gallium type compound semiconductor buffer layer 31 was formed so as to cover phosphor layer 2 coated with the transparent conductor film, followed by the sequential layering of N type nitride gallium type compound semiconductor layer 3, nitride gallium type compound semiconductor light emitting layer 4, and P type nitride gallium type compound semiconductor layer 5.

(3) At the back side of GaN substrate 10 was formed an ITO ($In_2O_3$ doped with Sn) 0.1 $\mu$m in thickness as N type electrode 8. Then, 1 $\mu$m-thick Au was provided as N type pad electrode 81. Then, 5 nm-thick Pd and 200 nm-thick Ag were provided as P type thick-film electrode 6 on P type nitride gallium type compound semiconductor layer 5. Then, the GaN substrate 10 wafer was diced into chips of 500 $\mu$m square. The P type thick-film electrode side was disposed at the bottom of the cup. In order to provide electrical contact between N type pad electrode 81 and an external source, an Au wire 9 was connected on N type pad electrode 81. By forming P type thick-film electrode 6 of high reflectance to reflect light towards the substrate, light is introduced efficiently into phosphor layer 2 coated with a transparent conductor film. Therefore, the conversion efficiency of the wavelength of the emitted light is improved.

The produced nitride gallium type compound semiconductor light emitting element that emits white light fabricated as described above is superior in light emitting efficiency and mass production. The wavelength of the light emitted from this light emitting element exhibited the two peaks of 480 nm and 587 nm. According to this nitride type compound semiconductor light emitting element, the phosphor layer formed at the light output side than the light emitting layer allows the wavelength of the emitted light to be converted into a different wavelength by the light emitting element alone. Wavelength conversion can be effected more efficiently since the phosphor layer is formed within the light emitting element.

EXAMPLE 3

Figure 3:
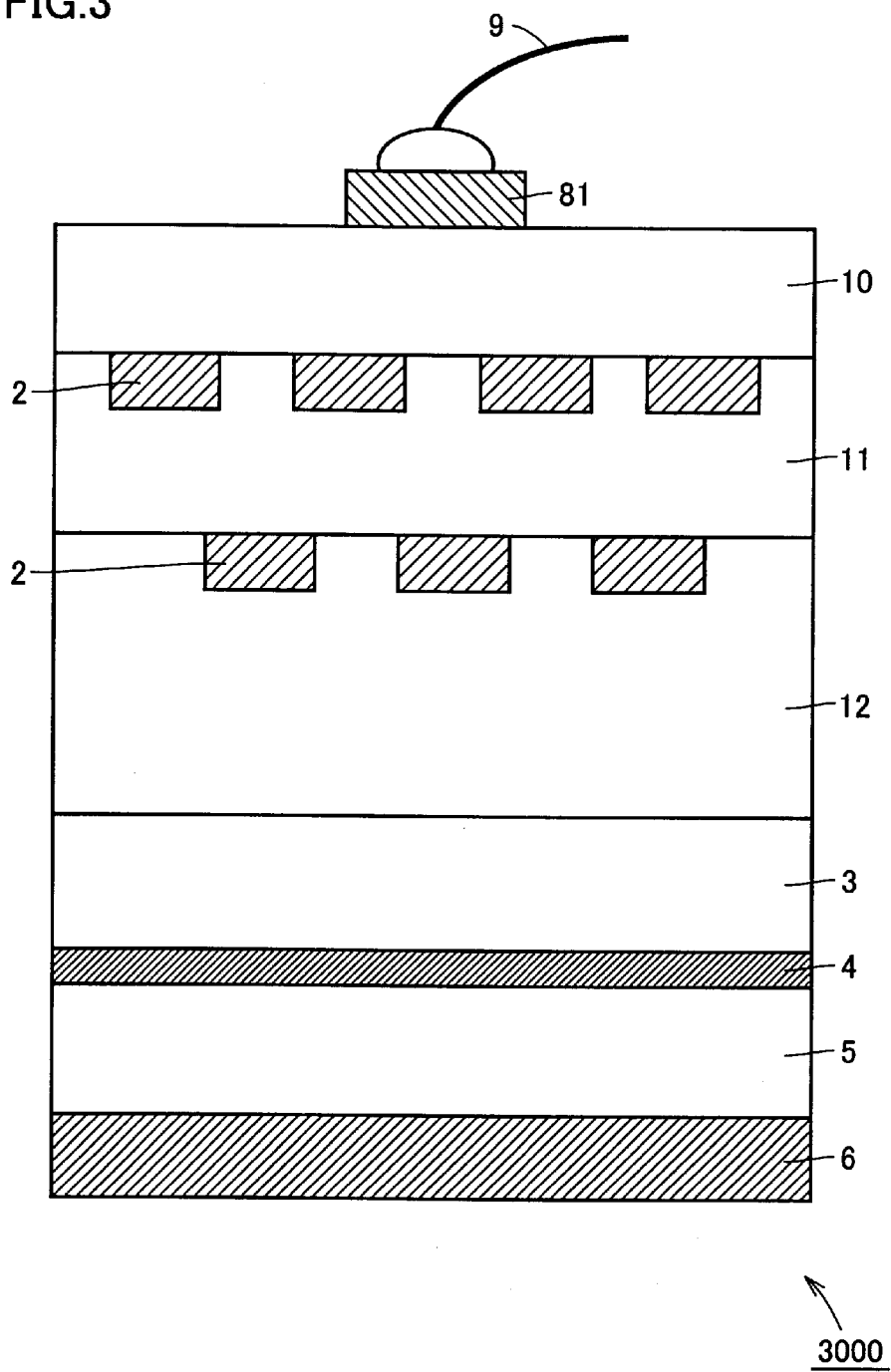

FIG. 3 is a schematic diagram of a nitride type compound semiconductor light emitting diode fabricated according to another example of the present invention.

An element structure 3000 of the present example includes, on a GaN substrate 10, a regrown GaN layer 11, a regrown GaN layer 12 thereon, an N type nitride gallium type compound semiconductor layer 3 thereon, a nitride gallium type compound semiconductor light emitting layer 4, a P type nitride gallium type compound semiconductor layer 5, a P type thick-film electrode 6 thereon, and an N type pad electrode 81 at the back side of GaN substrate 10. An Au wire 9 is provided on N type pad electrode 81. Element structure 3000 is characterized in that a phosphor layer 2 coated with the transparent conductor film is formed between GaN substrate 10 and regrown GaN layer 11, and another phosphor layer 2 coated with a transparent conductor film is formed between regrown GaN layer 11 and regrown GaN layer 12. The phosphor layers are provided in two stages.

The fabrication step of the present example will be described in further detail.

(1) According to a process similar to that of Example 1, phosphor layer 2 was formed on GaN substrate 10 (200 µm in thickness). A transparent conductor film was formed to cover this phosphor layer 2. The width and height of this phosphor layer 2 was 50 µm and 2.5 µm, respectively. The distance between these adjacent phosphor layers was 5 µm. Regrown GaN layer 11 was grown to the thickness of 100 µm. Then, another phosphor layer 2 was formed on regrown GaN layer 11. A transparent conductor film was applied so as to cover this phosphor layer 2. The width and thickness of this phosphor layer were 40 µm and 2.5 µm, respectively. The distance between these adjacent phosphor layers was 10 µm. GaN layer 12 thereon was grown to the thickness of 150 µm. Materials similar those of Example 1 can be used for phosphor layer 2.

(2) Then, N type nitride gallium type compound semiconductor layer 3, nitride gallium type compound semiconductor light emitting layer 4 and P type nitride gallium type compound semiconductor layer 5 were sequentially layered thereon.

(3) Then, P type thick-film electrode 6 was formed thereon. Here, 3 nm-thick Pd and 1 µm-thick Ag were provided as P type thick-film electrode 6. N type pad electrode 81 was formed at the back side of GaN substrate 10. A multilayer structure of Al (thickness 200 nm) and Ti (thickness 10 nm) was employed for N type pad electrode 31. Then, GaN substrate 10 wafer was diced into chips of 500 µm square. The P thick-electrode 6 side was disposed at the bottom of the cup. Au wire 9 was connected to provide electrical contact between N type pad electrode 81 and an external source.

The fabricated nitride gallium type compound semiconductor light emitting element that emits white light was superior in light emitting efficiency and mass production. The wavelength of the emitted light exhibited two peaks of 480 nm and 570 nm. The nitride type compound semiconductor light emitting element of the present example can convert the wavelength of the light from the light emitting layer efficiently into another wavelength by the excitation of the two stages of phosphor layers. The multi-stage formation of the phosphor layers within the substrate allows the GaN layer to be regrown for over several times. By using the phosphor layer as a selective growth mask, a conductive substrate of further thickness can be formed.

EXAMPLE 4

Figure 4:
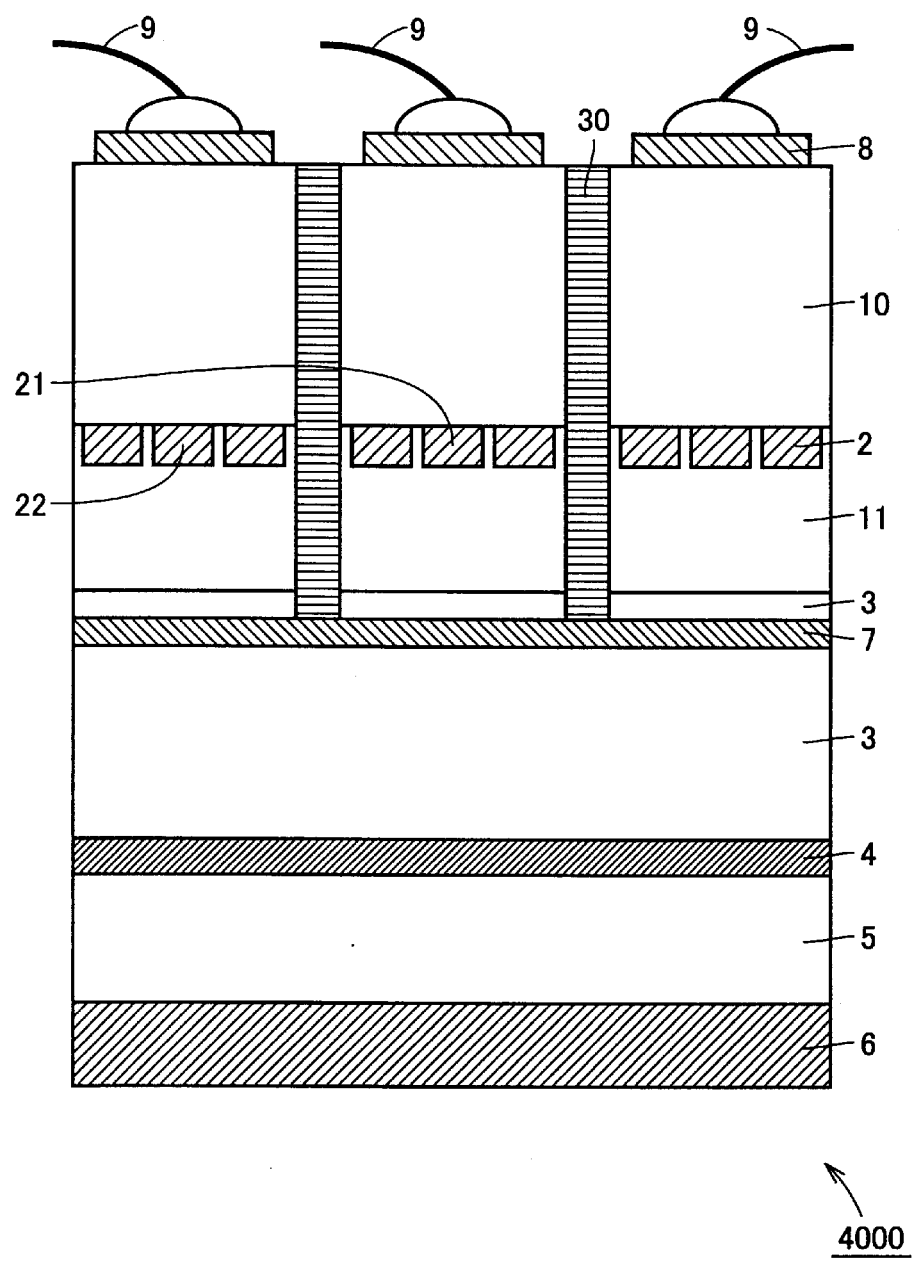

FIG. 4 shows a schematic diagram of a nitride type compound semiconductor light emitting element fabricated according to the present example.

An element structure 4000 of the present example includes a GaN substrate 10, a regrown GaN layer 11 thereon, an N type nitride gallium type compound semiconductor layer 3 thereon, an N type nitride gallium type compound semiconductor etch stop layer 7, an N type nitride gallium type compound semiconductor layer 3, a nitride gallium type compound semiconductor light emitting layer 4, a P type nitride gallium type compound semiconductor layer 5, a highly-reflective layer of a P type thick-film electrode 6 thereon, and an N type electrode 8 at the back side of GaN substrate 10. Phosphor layers 2, 21 and 22 coated with a transparent conductor film are formed between GaN substrate 10 and regrown GaN layer 11. Element structure 4000 of the present example is characterized in that the surface of etch stop layer 7 is exposed through GaN substrate 10 to form an isolation trench 30 isolating phosphor layers 2, 21 and 22 coated with a transparent conductor film.

The fabrication step of the present example will be described in further detail.

(1) According to a process similar to that of Example 1, phosphor layer 2 was formed on GaN substrate 1. A transparent conductor film was formed to cover phosphor layer 2. The width and thickness of this phosphor layer were 50 µm and 2.5 µm, respectively. The distance between these adjacent phosphor layers was 10 µm. Then, another phosphor layer 21 was formed. A transparent conductor film was formed to cover this phosphor layer 21. The width and thickness of this phosphor layer were 50 µm and 2.5 µm, respectively. The distance between these adjacent phosphor layers was 10 µm. Then, another phosphor layer 22 was formed. A transparent conductor film was formed to cover this phosphor layer 22. The width and thickness of phosphor layer 22 were 50 µm and 2.5 µm, respectively. The distance between these adjacent phosphor layers was 10 µm. Regrown GaN layer 11 was grown 300 µm in thickness on the surface where phosphor layers 2, 21 and 22 were formed.

(2) Then, N type nitride gallium type compound semiconductor layer 3 (thickness 2 µm), N type nitride gallium type compound semiconductor etch stop layer 7 (thickness 0.2 µm), N type nitride gallium type compound semiconductor layer 3 (thickness 3 µm), a nitride gallium type compound semiconductor quantum well light emitting layer 4 (thickness 25 nm) and P type nitride gallium type compound semiconductor layer 5 (thickness 0.5 µm) were sequentially layered.

(3) To form isolation trench 30 to isolate respective phosphor layers 2, 21 and 22, a resist (not shown) was applied at the back side of GaN substrate 10. By dry etching (here, RIE), the surface of N type nitride gallium type compound semiconductor etch stop layer 7 was exposed. The formation of etch stop layer 7 allows the surface of etch stop layer 7 to be exposed in favorable reproducibility from the etching selectivity. Here, isolation trench 30 has a dielectric film $SiO_2$ and an Al layer at the outer side formed as a reflective layer.

(4) Then, P type thick-film electrode 6 was formed. Here, Pd (thickness 15 nm) and Ag (thickness 0.5 $\mu$m) were provided for P type thick-film electrode 6. Hf (thickness 0.1 $\mu$m) was provided to form N type electrode 8 at the back side of GaN substrate 10. The GaN substrate 10 wafer was diced into chips of 1.5 mm square. Au wire 9 to provide electrical contact between N type electrode 8 and an external source was connected. The chip of the present example is preferably mounted as described above since the disposition of P type thick-film electrode 6 at the bottom of the cup of the lead frame allows improvement of heat dissipation and the light output.

As phosphor layer 2, $Y_2O_3$: Eu phosphor was employed. As phosphor layer 21, ZnS: Cu phosphor was employed. As phosphor layer 22, $\beta$ZnS: Ag was employed. Alternatively, a mixture of $Y_2O_3$: Eu phosphor and $Y_2O_3S$: Eu phosphor can be employed as phosphor layer 2. As phosphor layer 21, a ZnS: Cu phosphor, and a mixture of ZnS: Cu, Al phosphor and $Y_2Al_5O_{12}$: Tb phosphor can be employed. As phosphor layer 22, CaS: Bi phosphor or $3Sr_3(PO_4)_2 \cdot CaCl_2$: $Eu^{2+}$ phosphor can be employed. In the above example, phosphor layer 2 is indicative of a phosphor for conversion into red light, phosphor layer 21 is indicative of a phosphor for conversion into green light, and phosphor layer 22 is indicative of a phosphor for conversion into blue light. However, the location where these phosphor layers are formed may be replaced. Furthermore, formation of the phosphor layer of blue light is dispensable.

Thus, a light emitting element that emits multicolored light of red, green and blue, with uniform light emission and superior in light emitting efficiency, is provided. Since the phosphor layer is formed in the multilayer that constitutes the light emitting element, the wavelength of the emitted light can be converted into another wavelength by the light emitting element alone.

EXAMPLE 5

Figure 5:
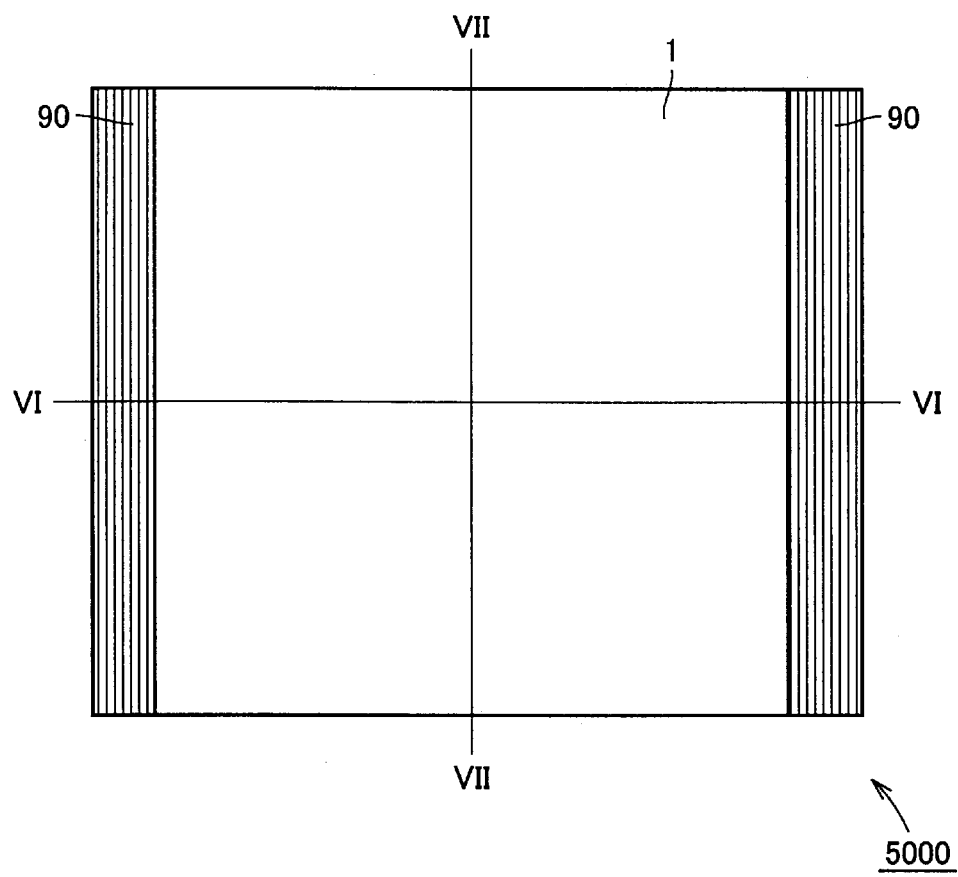
FIG. 5 is a schematic diagram of the top view of a nitride gallium type compound semiconductor light emitting element according to a fifth embodiment.
Figure 6:
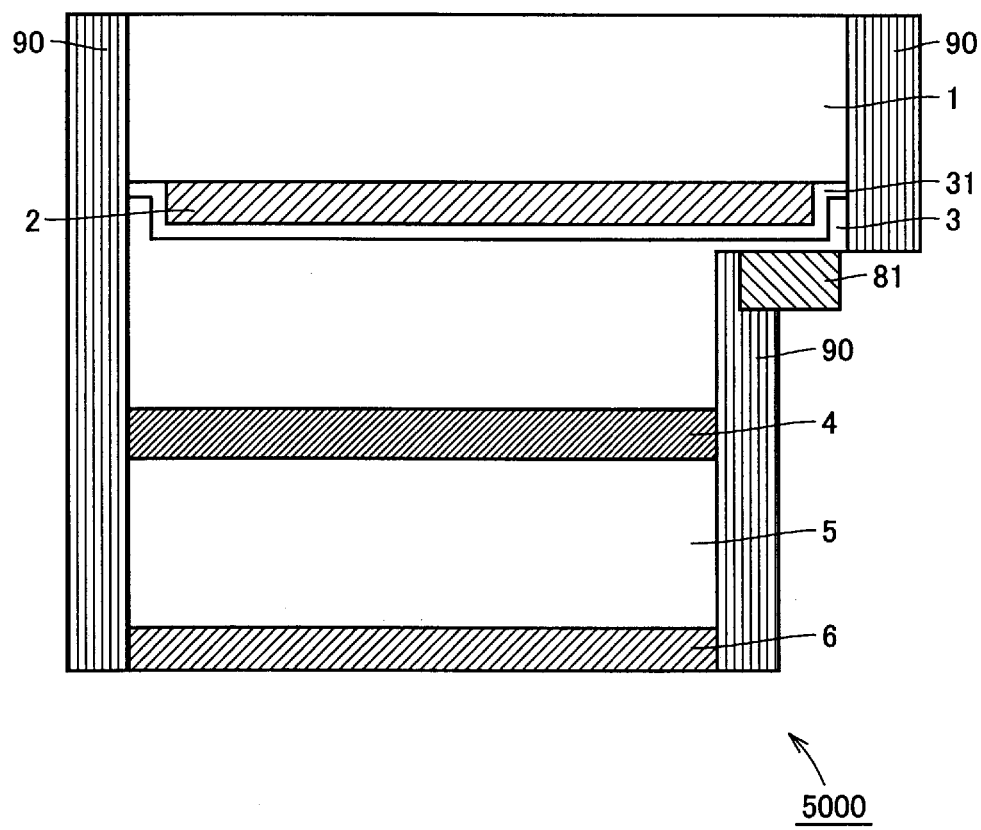
FIGS. 6 and 7 are schematic cross sectional views of the nitride gallium type compound semiconductor light emitting element of the fifth embodiment.
Figure 7:
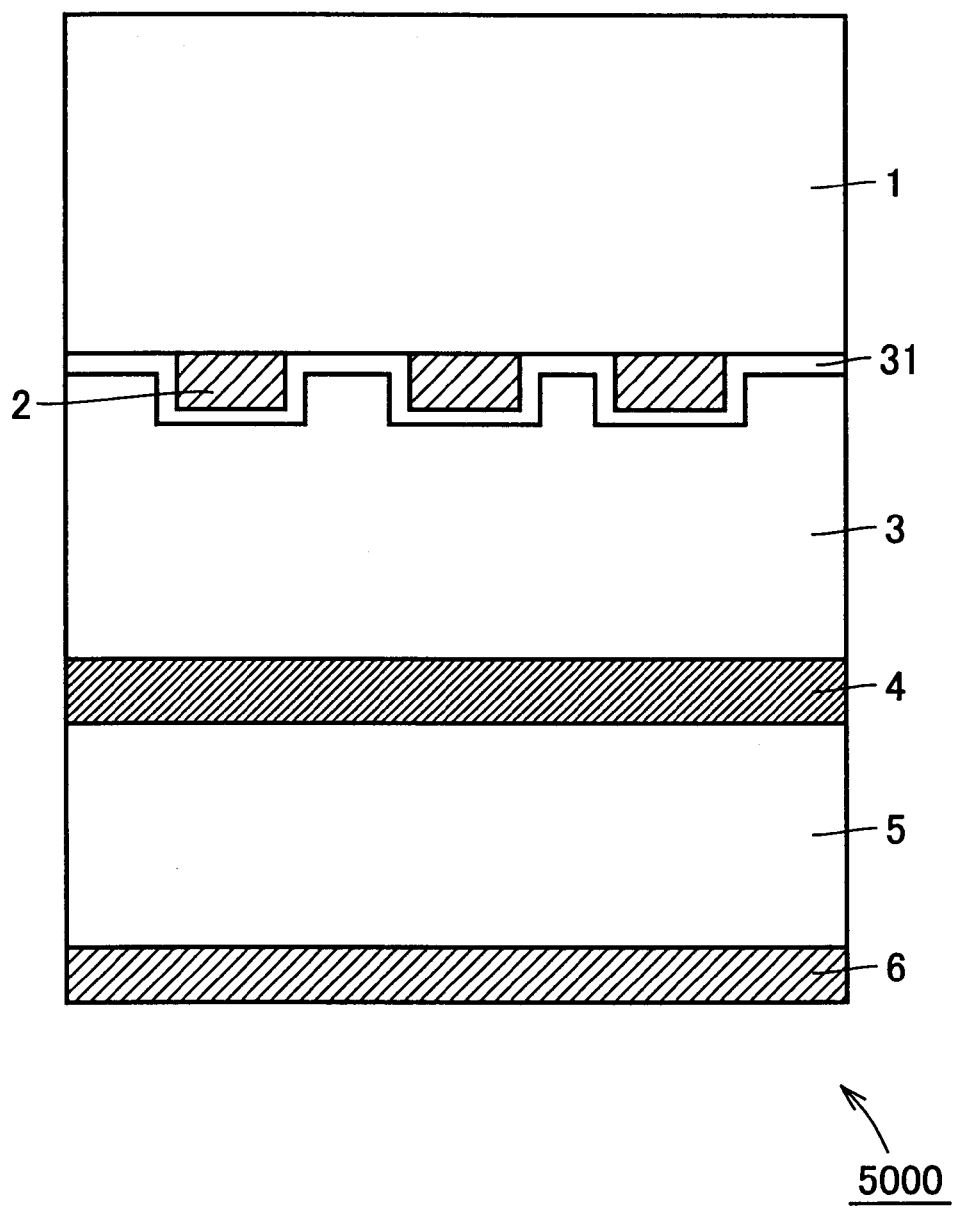

FIGS. 5, 6 and 7 show another example of the present invention. FIG. 5 is a schematic diagram of the top view of a light emitting element. FIGS. 6 and 7 are sectional views of the light emitting element of FIG. 5 taken along line VI—VI and line VII—VII, respectively, of FIG. 5.

An element structure 5000 of the present example has a multilayer structure similar to that of Example 1. A phosphor layer 2 coated with a transparent conductor film in stripes is formed between N type nitride gallium type compound semiconductor layer 3 and substrate 1. A highly-reflective layer 90 is formed at both sides of the multilayer structure.

The fabrication step of the present example will be described in further detail.

(1) Referring to FIGS. 5, 6 and 7, phosphor layer 2 coated with the transparent conductor film was formed on a sapphire substrate 1 according to a process similar to that of Example 1. Here, the width and height of the phosphor layer was 50 $\mu$m and 2 $\mu$m, respectively. The distance between adjacent phosphor layers was 10 $\mu$m. The thickness of the transparent conductor film formed on the phosphor layer was 0.3 $\mu$m. Here, $3Ca_3(PO_4)_2Ca(F, Cl)_2$: $Sb^{3+}$, $Mn^{2+}$ phosphor was employed as phosphor layer 2. Alternatively, a YAG type phosphor such as $(Y, Gd)_3(Al, Ga)_5O_{12}$: Ce, or $Ca_2P_2O_7$: Dy phosphor can be employed.

(2) Then, buffer layer 31, N type nitride gallium type compound semiconductor layer 3, a quantum well nitride gallium type compound semiconductor light emitting layer 4 formed of $In_{0.05}Ga_{0.95}N$, and a P type nitride gallium type compound semiconductor layer 5 were sequentially layered on phosphor layer 2 coated with a transparent conductor film.

(3) A resist (not shown) on the multilayer was employed as a mask for dry etching. By effecting dry etching until N type nitride gallium type compound semiconductor layer 3 was exposed, a light emitting region was formed. Then, N type pad electrode 81 was formed at the surface of N type nitride gallium type compound semiconductor layer 3. N type pad electrode 81 had the layered structure of Al (thickness 300 nm) and Ti (thickness 20 nm). As P type thick-film electrode 6, 7 nm-thick Pd and 200 nm-thick Ag were provided on P type nitride gallium type compound semiconductor layer 5. The sapphire substrate 1 wafer was diced into stripe bars of 500 $\mu$m. Then, 15 sets of $SiO_2$ (thickness 83 nm) and $TiO_2$ (thickness 40 nm) were deposited through electron beam vapor deposition as highly-reflective layer 90 at both sides of the bar. The bar was diced into chips of 500 $\mu$m square. P type thick-film electrode 6 was disposed at the bottom of the cup. To provide electrical contact between N type pad electrode 81 and an external source, an Au wire was connected onto N type pad electrode 81. The light generated from quantum well nitride gallium type compound semiconductor light emitting layer 4 is subjected to multiple reflection at highly-reflective layer 90 provided at both sides of the light emitting element to enter the phosphor layer efficiently as excited light (light generated at the light emitting layer). Since P type thick-film electrode 6 functions as a highly-reflective layer and the light towards P type nitride gallium type compound semiconductor layer 5 is reflected upwards, light is introduced efficiently into phosphor layer 2 coated with a transparent conductor film. Therefore, wavelength conversion of the emitted light is improved. Here, the light generated by the light emitting layer and the excited light of a different wavelength are emitted outwards from the side plane where highly-reflective layer 90 is not formed, and the back side of substrate 1.

The fabricated nitride type compound semiconductor light emitting element that emits white light is superior in light emitting efficiency and mass production. The wavelength of the emitted light exhibited two peaks of 470 nm and 570 nm.

EXAMPLE 6

Figure 8:
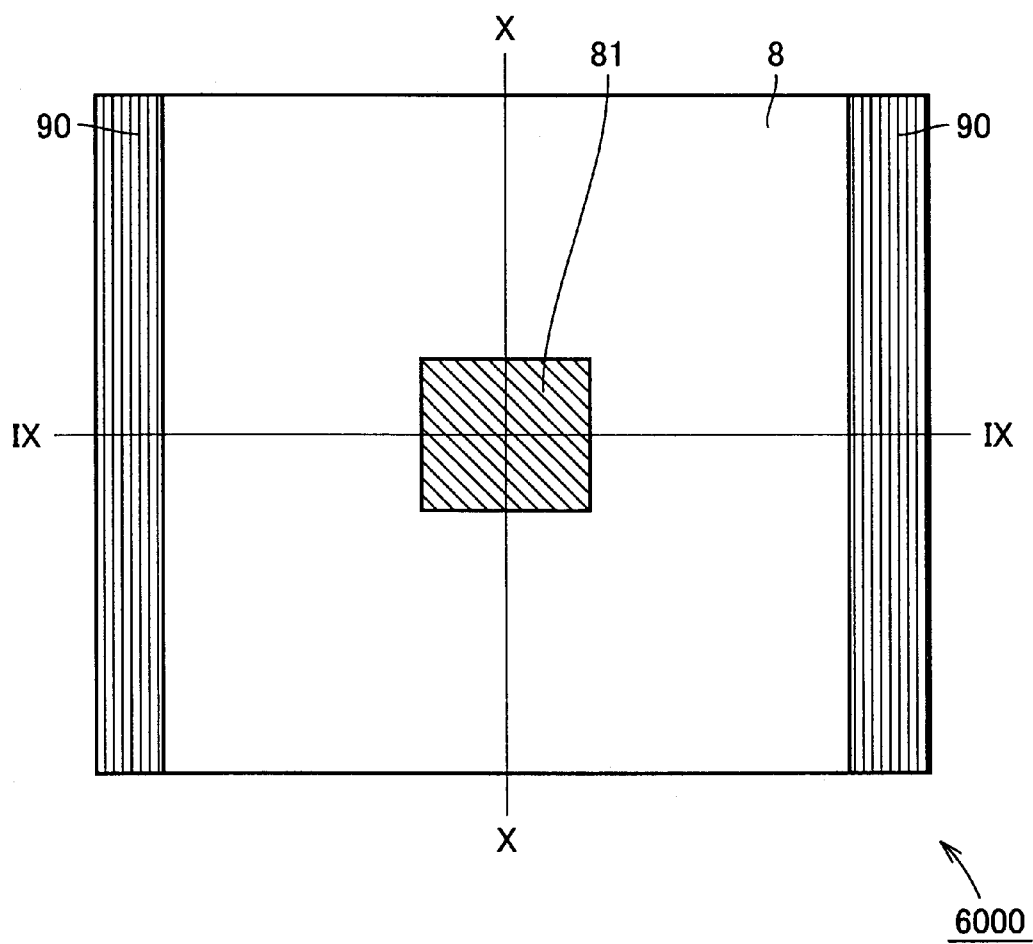
FIG. 8 is a schematic diagram of the top view of a nitride gallium type compound semiconductor light emitting element according to a sixth embodiment.
Figure 9:
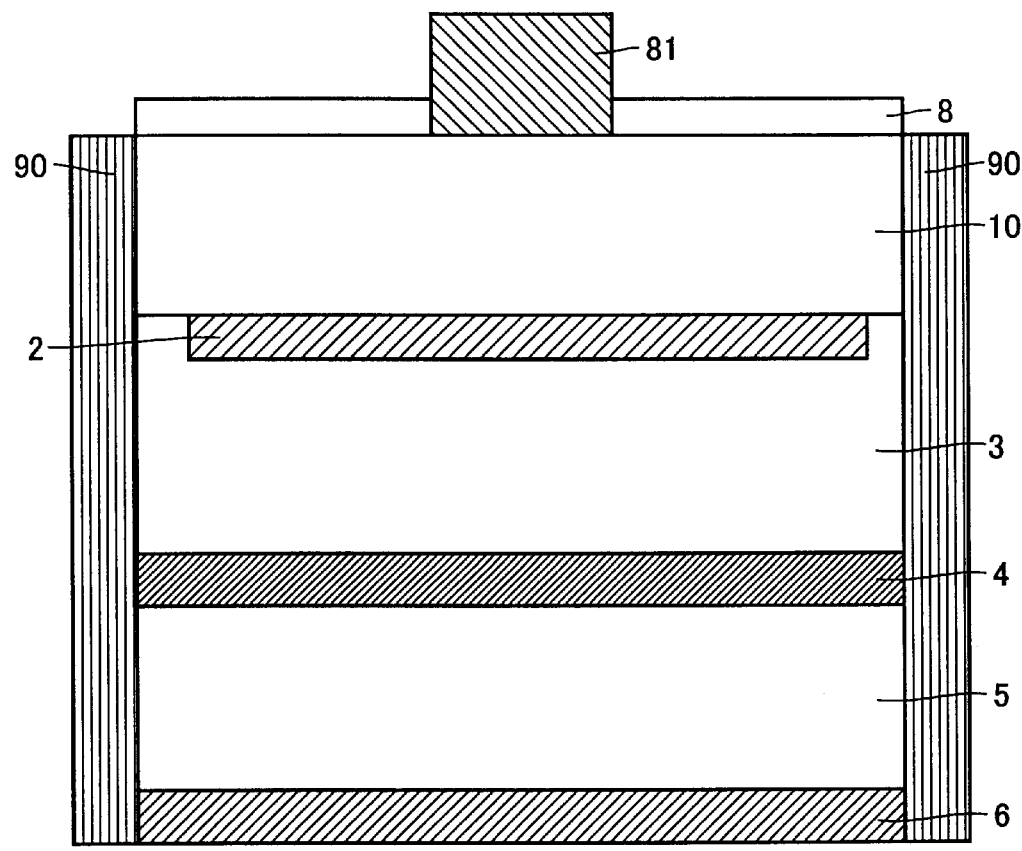
FIGS. 9 and 10 are schematic cross sectional views of a nitride gallium type compound semiconductor light emitting element of the sixth embodiment.
Figure 10:
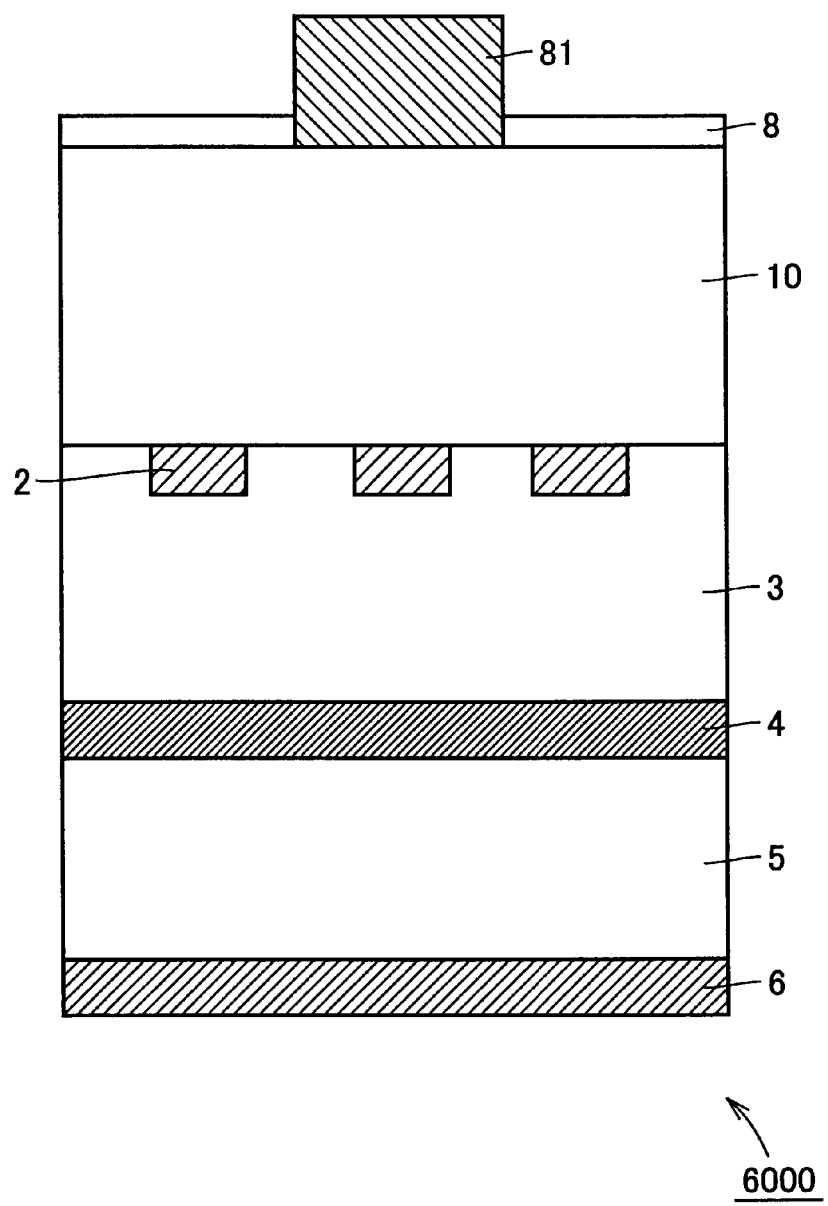

FIG. 8 shows a top view of a nitride type compound semiconductor light emitting element fabricated by another example of the present invention. FIGS. 9 and 10 are cross sections of the nitride type compound semiconductor light emitting element of FIG. 8 taken along line IX—IX and line X—X, respectively, of FIG. 8.

An element structure 6000 of the present example has a multilayer structure similar to that of Example 2, provided that buffer layer 31 present in Example 2 is not formed. Element structure 6000 of the present example is characterized in that a phosphor layer 2 coated with a transparent conductor film is formed between conductive GaN substrate 10 and N type nitride gallium type compound semiconductor layer 3, and a highly-reflective layer 90 is formed at both sides of the multilayer structure.

The fabrication step of the present example will be described in the further detail.

(1) According to a process similar to that of Example 1, phosphor layer 2 coated with the transparent conductor film was formed on conductive GaN substrate 10. Here, the width and height of the phosphor layer were 40 $\mu$m and 2 $\mu$m, respectively. The distance between adjacent phosphor layers was 10 $\mu$m. The thickness of the transparent conductor film formed to cover the phosphor layer was 0.5 $\mu$m. Here, $3Ca_3(PO_4)_2 \cdot Ca(F, Cl)_2:Sb^{3+}, Mn^{2+}$ phosphor was employed as phosphor layer 2. Alternatively, a YAG type phosphor such as $(Y, Gd)_3(Al, Ga)_5O_{12}:Ce$ or $Ca_2P_2O_7:Dy$ phosphor can be employed as phosphor layer 2.

(2) Then, an N type nitride gallium type compound semiconductor layer 3, a nitride gallium type compound semiconductor light emitting layer 4 formed of $In_{0.1}Ga_{0.9}N$ and a P type nitride gallium type compound semiconductor layer 5 were sequentially layered so as to cover phosphor layer 2 coated with a transparent conductor film.

(3) Then, Au was provided 1 $\mu$m in thickness for N type pad electrode 81 at the back side of conductive GaN substrate 10. Then, ITO of 0.1 $\mu$m in thickness was provided as N type electrode 8. The ITO formed on N type pad electrode 81 was removed with an iron chloride type etching solution. As P type thick-film electrode 6, Pd (thickness 5 nm) and Ag (thickness 200 nm) were provided on P type nitride gallium type compound semiconductor layer 5. The wafer was diced into stripes of 500 $\mu$m to form bars. 20 sets of $SiO_2$ (thickness 83 nm) and $Al_2O_3$ (thickness 67 nm) were provided by electron beam vapor deposition at both sides of the bar as highly-reflective layer 90. Then, the GaN substrate 10 wafer was formed into chips of 500 $\mu$m square by scribing. P type thick-film electrode 6 was disposed at the bottom of the cup. An Au wire was connected onto N type pad electrode 81 to provide electrical contact between N type pad electrode 81 and an external source.

The light emitted from quantum well nitride gallium type compound semiconductor light emitting layer 4 is subjected to multiple reflection at highly-reflective layer 90 provided at both sides of the light emitting element. Accordingly, excited light efficiently enters the phosphor layer. Since P type thick-film electrode 6 also functions as a highly-reflective layer and the light towards P type nitride gallium type compound semiconductor layer 5 is reflected upwards, light enters phosphor layer 2 coated with a transparent conductor film efficiently. Thus, the wavelength conversion efficiency of the emitted light into another wavelength is improved. The light generated at the light emitting layer and the excited light of a different wavelength are radiated outwards from the side plane were highly-reflective layer 90 is not formed and from the back side of substrate 1.

The fabricated nitride type compound semiconductor light emitting element that emits white light is superior in light emitting efficiency and mass production. The wavelength of the emitted light has two peaks of 480 nm and 570 nm. The formation of a mixture having a transparent conductor film applied on the surface of the phosphor layer below the light emitting layer in the nitride type compound semiconductor light emitting element allows that wavelength of the emitted light to be converted into another wavelength by the light emitting element alone.

Furthermore, since the phosphor layer is located in the proximity of the light emitting layer, the conversion efficiency of the wavelength of the emitted light is improved.

Seventh Embodiment

Figure 11:
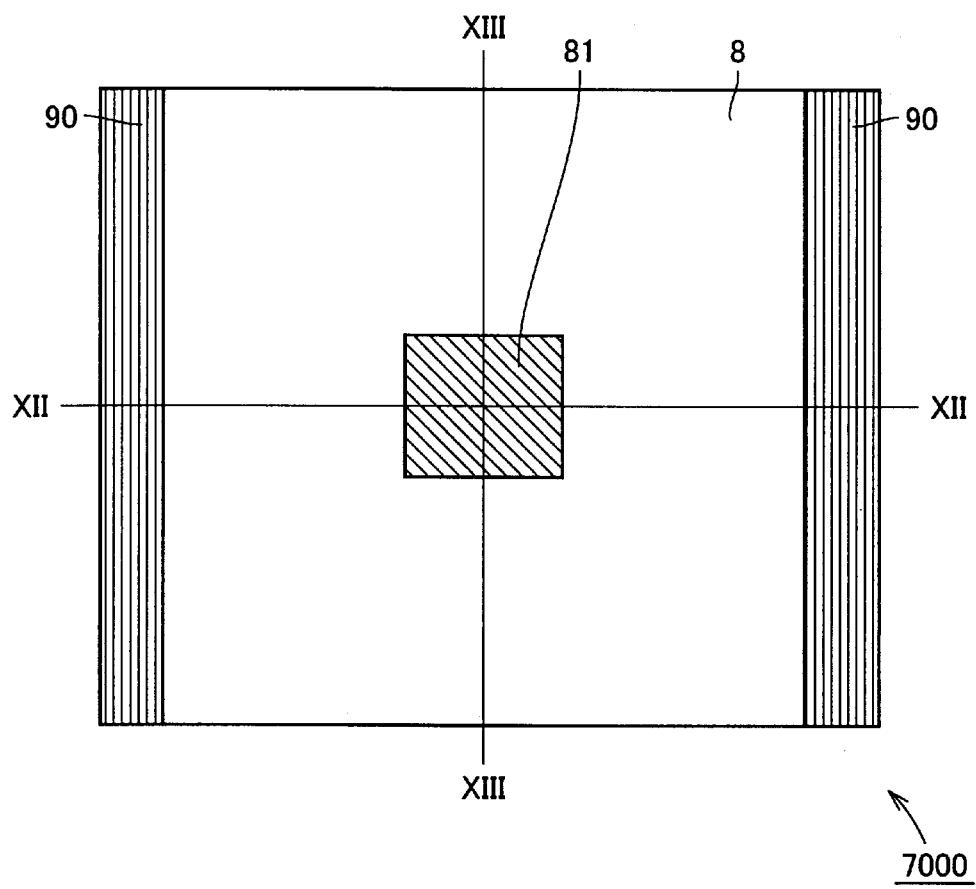
FIG. 11 is a schematic diagram of the top view of a nitride gallium type compound semiconductor light emitting element according to a seventh embodiment.
Figure 12:
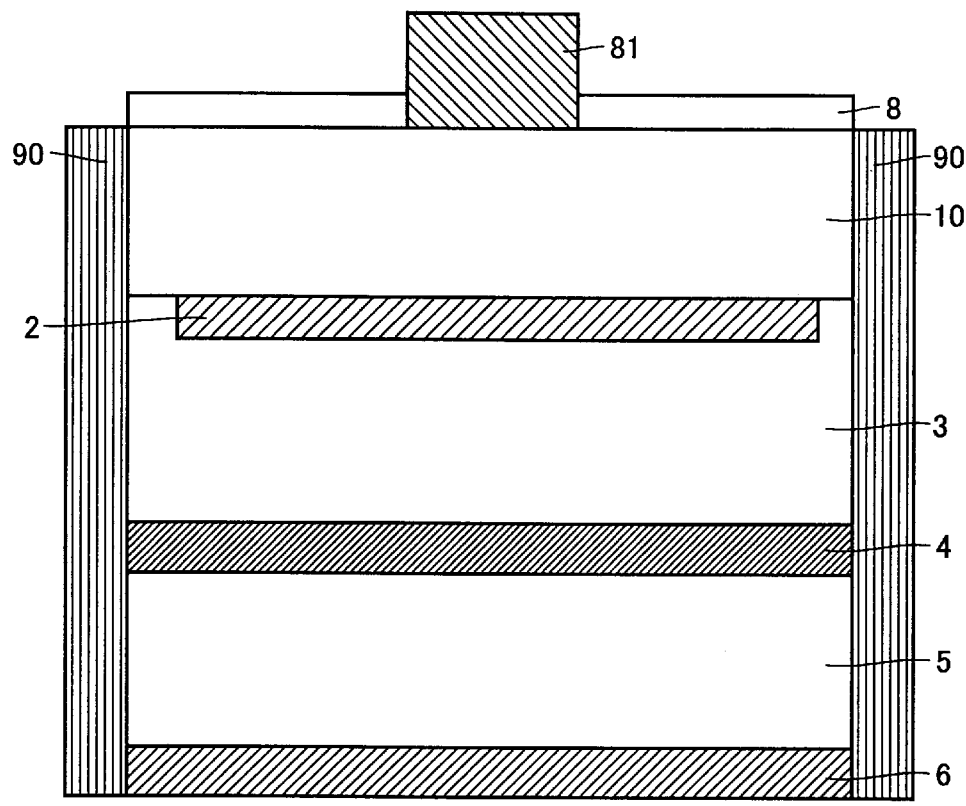
FIGS. 12 and 13 are schematic cross sectional views of the nitride gallium type compound semiconductor light emitting element of the seventh embodiment.
Figure 13:
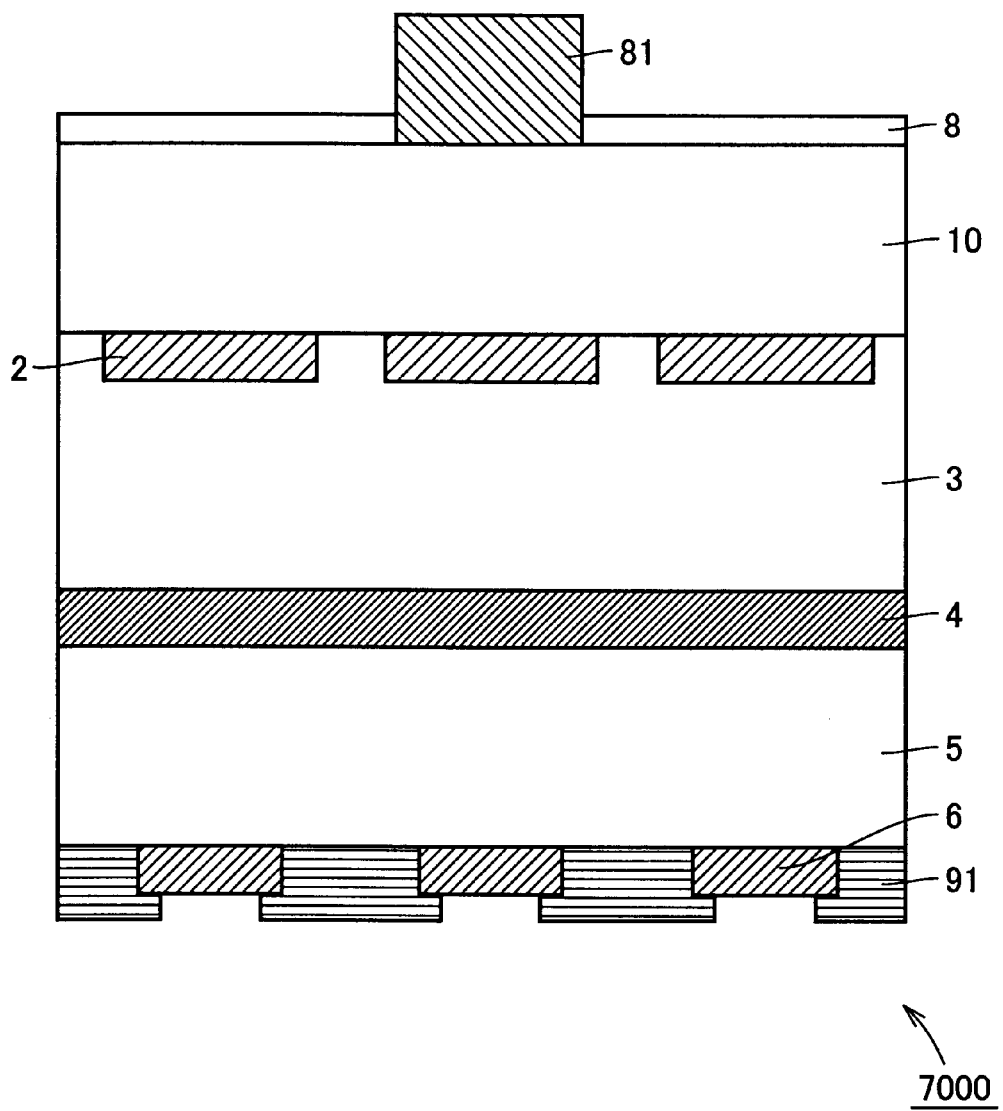

FIG. 11 is a schematic diagram of the top view of a nitride type compound semiconductor light emitting element according to another example of the present invention. FIGS. 12 and 13 are cross sectional views of the nitride type compound semiconductor light emitting element of FIG. 11 taken along lines XII—XII and XIII—XIII, respectively.

An element structure 7000 of the present example includes, on a GaN substrate 10, an N type nitride gallium type compound semiconductor layer 3, a nitride gallium type compound semiconductor light emitting layer 4, a P type nitride gallium type compound semiconductor layer 5, a P type thick-film electrode 6 thereon, an N type electrode 8 at the back side of GaN substrate 10, and an N type pad electrode 81. Element structure 7000 is characterized in that a phosphor layer 2 coated with a transparent conductor film is provided between GaN substrate 10 and N type nitride gallium type compound semiconductor layer 3, a P type thick-film electrode 6 is formed in stripes, a highly-reflective layer 91 is additionally formed at the plane of P type thick-film electrode 6, and a highly-reflective layer 90 is formed at both sides of the light emitting element, orthogonal to the electrode in stripes.

The fabrication step of the nitride type compound semiconductor light emitting element of the present example will be described in further detail with reference to FIGS. 11, 12 and 13.

(1) According to a process similar to that of Example 1, a phosphor layer 2 coated with a transparent conductor film was formed on a GaN substrate 10 (thickness 200 $\mu$m). The width and thickness of this phosphor layer 2 were 50 $\mu$m and 2.5 $\mu$m, respectively. The distance between adjacent phosphor layers was 8 $\mu$m.

(2) Then, an N type nitride gallium type compound semiconductor layer 3, an InGaN nitride gallium type compound semiconductor light emitting layer 4, and a P type nitride gallium type compound semiconductor layer 5 were sequentially layered thereon.

(3) A P type thick-film electrode 6 was formed thereon. Here, Pd (thickness 3 nm) and Ag (thickness 1 $\mu$m) were provided as P type thick-film electrode 6. P type thick-film electrode 6 was formed into stripes with a nitric acid type etching solution. ITO (thickness 0.1 $\mu$m) was provided at the back side of GaN substrate 10 as an N type electrode to form N type pad electrode 81. N type pad electrode 81 had a layered structure of Al (thickness 200 nm) and Ti (thickness 10 nm). The GaN substrate 10 wafer was diced into a bar of 500 $\mu$m in width. At both of the shorter sides of the bar were provided 10 sets of $SiO_2$ (thickness 83 nm) and $TiO_2$ (thickness 40 nm) by electron beam evaporation as highly-reflective layer 90. Then, as highly-reflective layer 91, 10 sets of $SiO_2$ (thickness 83 nm) and $TiO_2$ (thickness 40 nm) were provided by electron beam vapor deposition at the plane were P type thick-film electrode 6 in a bar configuration was formed. Then, an electrical contact was formed by removing the insulator film on P type thick-film electrode 6 using a hydrofluoric acid type etching solution. Substrate 10 of a bar configuration was diced into chips of 500 $\mu$m square. The P type thick-film electrode 6 side was disposed at the bottom of the cup. An Au wire was connected on N type pad electrode 81 to provide electrical contact with an external source.

Here, $3Ca_3(PO_4)_2 \cdot Ca(F, Cl)_2$: $Sb^{3+}$, $Mn^{2+}$ phosphor was employed as the covered phosphor layer 2. Alternatively, a YAG type phosphor such as $(Y, Gd)_3(Al, Ga)_5O_{12}$: Ce can be used as the covered phosphor layer 2.

Here, the light generated at the light emitting layer and the excited light of a different wavelength will be radiated outwards from the side where highly-reflective layer 90 is not formed and from the back side of substrate 1. Thus, the fabricated nitride type compound semiconductor light emitting element that emits white light is superior in light emitting efficiency and mass production. The wavelength of the emitted light exhibits the two peaks of 480 nm and 570 nm. By introducing current in a concentrated manner into the light emitting layer by virtue of the electrode-stripe element structure, the power of the excited light introduced into the phosphor layer is increased. Also, the phosphor layer region is formed so as to correspond to the light emitting region of the light emitting layer. Therefore, the excited light can be introduced efficiently. The wavelength of the emitted light can be converted into another wavelength by the light emitting element alone. Furthermore, since the phosphor layer is formed in the proximity of the light emitting layer, the conversion efficiency of the wavelength of the emitted light is further improved.

The present example is based on a structure in which the excited light is introduced into the phosphor layer efficiently by virtue of the electrode-stripe structure. A current stop layer can be formed in the light emitting element to introduce the current in a condensed manner, whereby the power of the excited light into the phosphor layer is increased. The phosphor layer region may be formed so as to correspond to the light emitting region of the light emitting layer. Also, a current stop layer can be formed in the proximity of the center of the light emitting element and introduce the current in a condensed manner around the light emitting element. The phosphor layer is formed at the neighborhood. In such an element structure, an advantage similar to that described above can be obtained.

It is needless to say that the nitride type compound semiconductor light emitting element is a light emitting diode (LED) or a semiconductor laser (LD).

EXAMPLE 8

Figure 14:
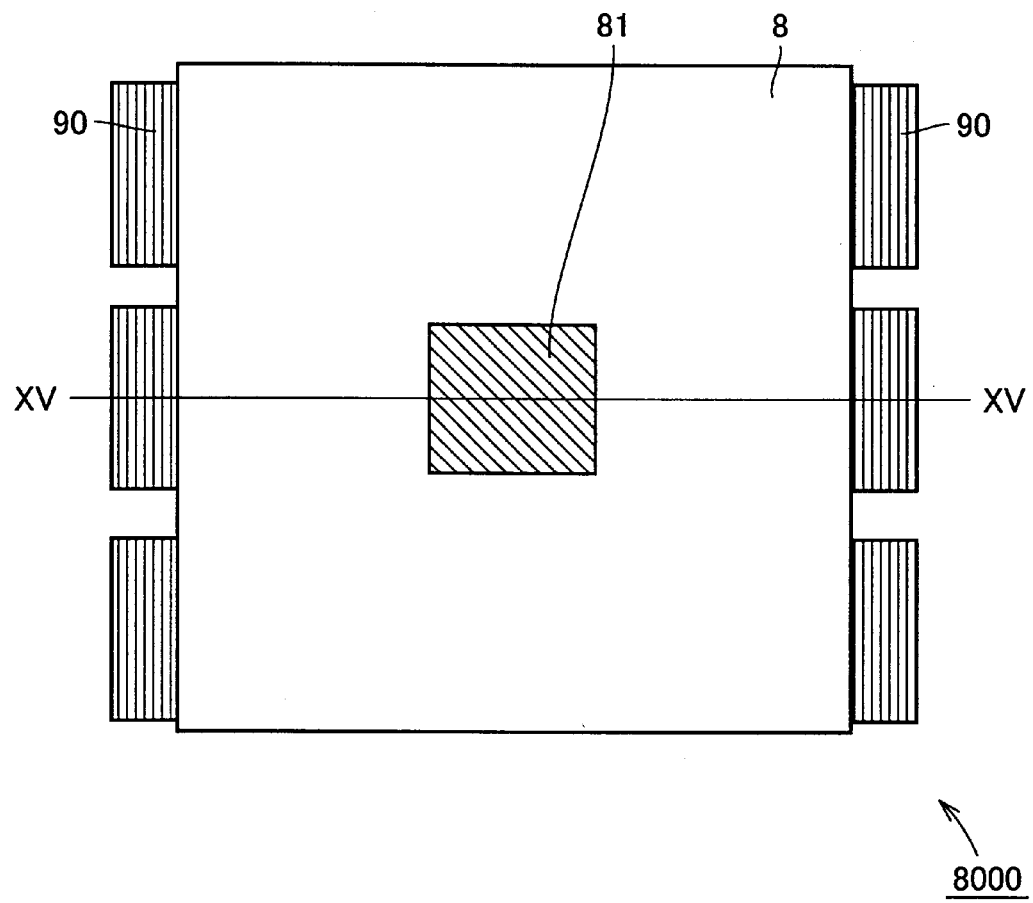
FIG. 14 is a schematic diagram of the top view of a nitride gallium type compound semiconductor light emitting element according to an eighth embodiment.
Figure 15:
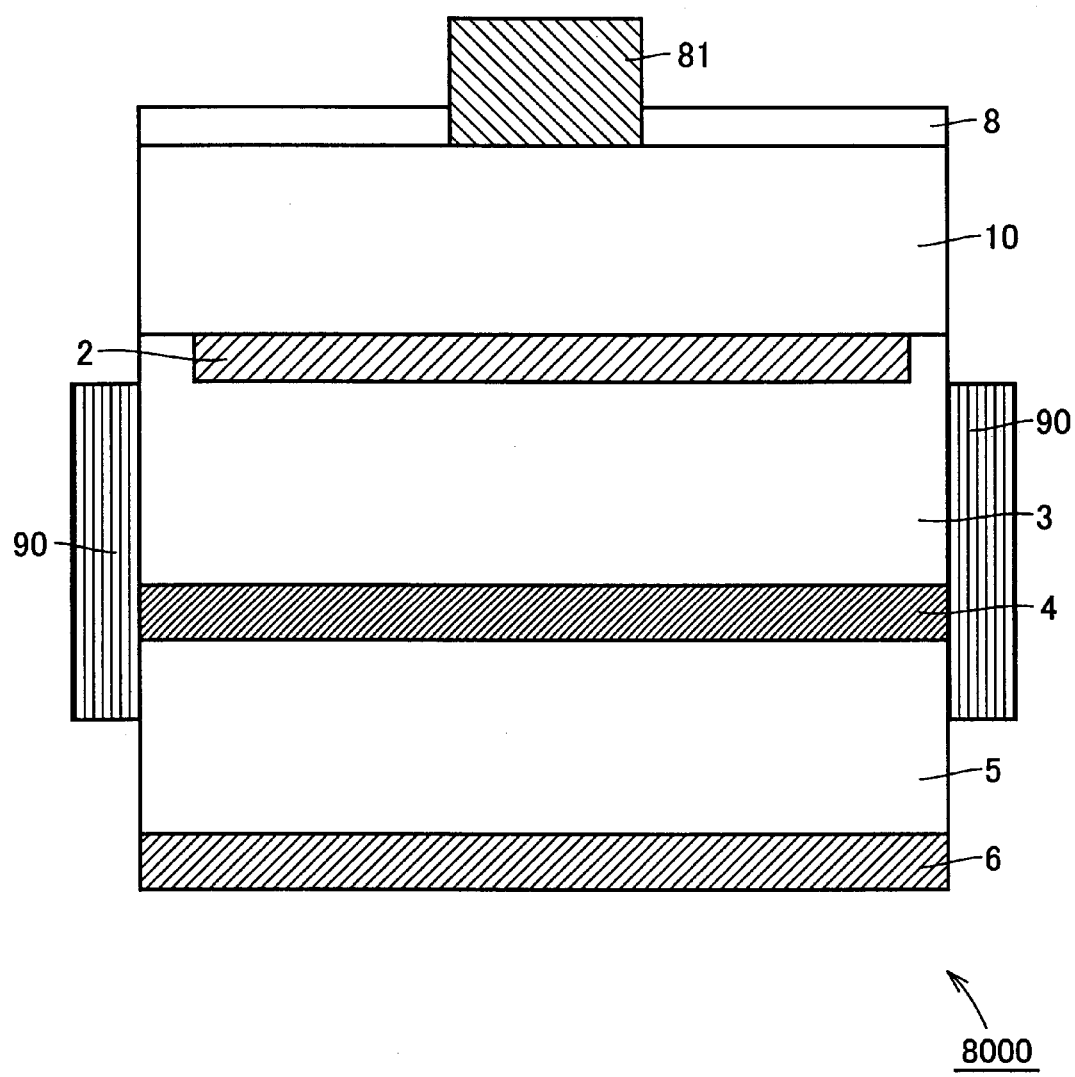
FIGS. 15 and 16 are schematic cross sectional views of a nitride gallium type compound semiconductor light emitting element according to eighth and ninth embodiments, respectively.

FIG. 14 is a schematic diagram of a top view of a nitride type compound semiconductor light emitting element fabricated according to another example of the present invention. FIG. 15 is a sectional view of the nitride type compound semiconductor light emitting element of FIG. 14 taken along line XV—XV.

An element structure 8000 of the present example is similar to the element structure of Example 6 provided that the highly-resistive layer is a portion of the side plane of the multilayer structure. Element structure 8000 of the present example is characterized in that highly-reflective layer 90 is formed at three sites of the side plane including the light emitting layer.

The fabrication step of the nitride type compound semiconductor light emitting element of the present example will be described in further detail with reference to FIGS. 14 and 15.

(1) According to a process similar to that of Example 1, a phosphor layer 2 was formed on a GaN 10. This phosphor layer had a width of 40 $\mu$m and a thickness of 2.5 $\mu$m. The distance between adjacent phosphor layers was 10 $\mu$m.

(2) Then, an N type nitride gallium type compound semiconductor layer 3 (thickness 3 $\mu$m), a nitride gallium type compound semiconductor light emitting layer 4 of $In_{0.2}Ga_{0.8}N$ single quantum well (thickness 3 nm) and a P type nitride gallium type compound semiconductor layer 5 (thickness 0.5 $\mu$m) were sequentially layered thereon.

(4) Then, a P type thick-film electrode 6 was formed. Here, Pd (thickness 15 nm) and Ag (thickness 0.5 $\mu$m) were provided as electrode 6. Hf (thickness 5 nm) was provided as N type electrode 8 and Au thickness (0.5 $\mu$m) was provided as N type pad electrode 81 at the back side of GaN substrate 10. Then, the wafer substrate was diced into a bar of 500 $\mu$m in width. Then, 15 sets of $SiO_2$ (thickness 83 nm) and $Al_2O_3$ (thickness 67 nm) were provided by electron beam vapor deposition as highly-reflective layer 90 at both of the shorter sides of the bar. Here, highly-reflective layer 90 was partially etched using a fluoric acid etching solution so that highly-reflective layer 90 was located at the side plane consistent with the phosphor layer. Then, the bar was diced into chips of 500 $\mu$m square. The P type thick-film electrode 6 side was disposed at the bottom of the cup. An Au wire was connected on N type pad electrode 81 to provide electrical contact with an external source.

Here, $3Ca3(PO_4)_2 \cdot Ca(F, Cl)_2$: $Sb^{3+}$, $Mn^{2+}$ phosphor was employed for the covered phosphor layer 2. Also, a YAG type phosphor such as $(Y, Gd)_3 (Al, Ga)_5O_{12}$: Ce may be employed for the covered phosphor layer 2. Also, $Y_2O_3$: Eu phosphor ZnS:Cu phosphor, a mixture of $Y_2O_3$: Eu phosphor, and $Y_2O_3S$: Eu phosphor, ZnS: Cu phosphor, and a mixture of ZnS: Cu, Al phosphor and $Y_2Al_5O_{12}$: Tb phosphor may be employed. CaS: Bi phosphor or $3Sr_3(PO_4)_2 \cdot CaCl_2$: $Eu^{2+}$ phosphor may be employed. Multicolored light can be achieved by forming a different phosphor layer for conversion into red, blue and green as the adjacent phosphor layers.

The light generated from quantum well nitride gallium type compound semiconductor light emitting layer 4 is subjected to multiple reflection at highly-reflective layer 90 provided at both sides of the light emitting element, whereby excited light is introduced efficiently into the phosphor layer. Since P type thick-film electrode 6 functions as a highly reflective layer and the light towards P type nitride gallium type compound semiconductor layer 5 is reflected upwards, light is introduced efficiently into phosphor layer 2 covered with a transparent conductor film. Thus, the wavelength conversion efficiency is further improved. The light generated at the light emitting layer and the excited light of a different wavelength are radiated outside from the side plane where highly-reflective layer 90 is not provided and from the back side of substrate 1. In the present example, the generated light and wavelength-converted light can be output from the side plane where highly-reflective layer 90 is partially formed. Thus, the light emitting element of the present example can effectively utilize the radiated light from the side plane and top plane of the light emitting element.

Thus, a nitride type compound semiconductor light emitting element that emits white light, superior in light emitting efficiency and mass production, is fabricated. The wavelength of the emitted light exhibits two peaks of 480 nm and 570 nm. In the nitride type compound semiconductor light emitting element of the present example, a mixture having a transparent conductor film applied at the surface of a phosphor layer is provided below the light emitting layer. Therefore, the emitted light can be converted in wavelength by the light emitting element alone. Furthermore, since the phosphor layer is formed in the proximity of the light emitting layer, the conversion efficiency of the wavelength of the emitted light can be further improved.

By altering the phosphor layer, a multicolor light emitting element that emits light of red, green and blue that is uniform and superior in light emitting efficiency can be provided. The formation of a mixture having a transparent conductive film applied at the surface of a phosphor within the multilayer constituting the light emitting element allows the wavelength of the emitted light to be converted into a different wavelength by the light emitting element alone.

It is needless to say that the nitride type compound semiconductor light emitting element includes a light emitting diode (LED) or a semiconductor laser (LD).

EXAMPLE 9

Figure 16:
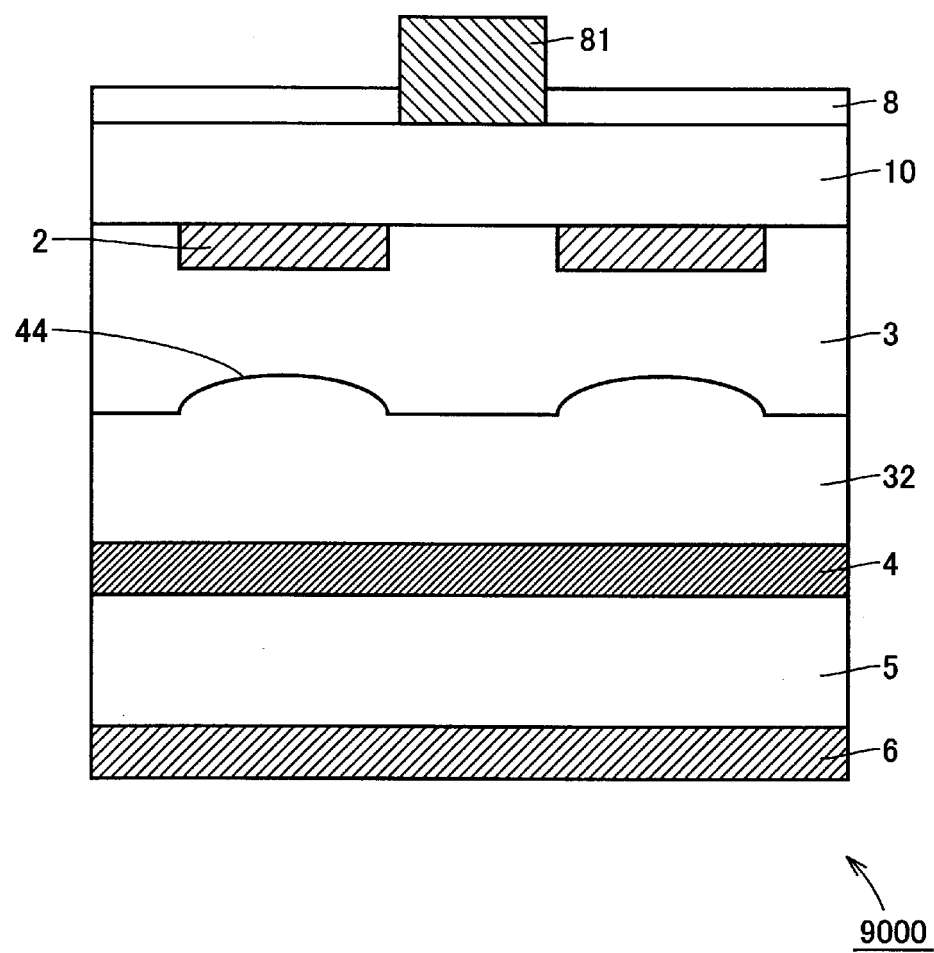

FIG. 16 is a cross sectional view of a nitride type compound semiconductor light emitting element fabricated according to another example. The layered structure of an element structure 9000 of the present example is similar to that of Example 6, provided that a concave 44 is formed in N type nitride gallium type compound semiconductor layer 3, and an N type nitride gallium type compound semiconductor layer 32 is provided thereon.

The fabrication step of the nitride type compound semiconductor light emitting element of the present example will be described in further detail with reference to FIG. 16.

(1) According to a process similar to that of Example 1, a phosphor layer 2 coated with a transparent conductor film was formed on a GaN substrate 10. Here, the width and height of the phosphor layer were 40 μm and 2 μm, respectively. The distance between adjacent phosphor layers was 10 μm. Here, $3Ca_3(PO_4)_2 \cdot Ca(F, Cl)_2$: $Sb^{3+}$, $Mn^{2+}$ phosphor was employed as the covered phosphor layer 2. Also, a YAG type phosphor such as $(Y, Gd)3 (Al, Ga)5Cl_2$: Ce or $Ca_2P_2O_7$: Dy phosphor may be employed as the covered phosphor layer 2.

(2) An N type nitride gallium type compound semiconductor layer 3 was deposited so as to cover phosphor layer 2 coated with a transparent conductor film. This wafer was output from a deposition apparatus. A concave was formed by dry etching at the surface of N type nitride gallium type compound semiconductor layer 3 where phosphor layer 2 coated with a transparent conductor film was formed.

(3) An N type nitride gallium type compound semiconductor layer 32, a nitride gallium type compound semiconductor light emitting layer 4 of $In_{0.15}Ga_{0.85}N$, and then a P type nitride gallium type compound semiconductor layer 5 were sequentially layered on N type nitride gallium type compound semiconductor layer 3 with a concave region.

(4) Then, ITO (thickness 0.1 μm) was formed as N type electrode 8 at the back side of GaN substrate 10. Then, Au was formed (thickness 1 μm) as N type pad electrode 81. Then, Pd (5 nm) and Ag (thickness 200 nm) were provided as P type thick-film electrode 6 on P type nitride gallium type compound semiconductor layer 5. The wafer substrate was diced into a chip of 500 μm square. The P type thick-film electrode side was disposed at the bottom of the cup. Then, an Au wire was connected on N type pad electrode 81 to provide electrical contact between N type pad electrode 81 and an external source.

In the present example, the light emitted from the light emitting layer can be gathered at the concave formed at N type nitride gallium type compound semiconductor layer 3 to introduce light efficiently to phosphor layer 2 formed above. Therefore, the wavelength conversion efficiency is improved. Since P type thick-film electrode 6 of high reflectance is formed to reflect light towards the substrate, light is introduced efficiently to phosphor layer 2 covered with a transparent conductor film. Thus, the efficiency is improved. The light radiated from the light emitting element is output from the side plane and the back side of substrate 1.

Thus, a nitride type compound semiconductor light emitting element that emits white light, superior in light emitting efficiency and mass production, can be fabricated. The wavelength of the emitted light exhibited two peaks of 480 nm and 570 nm. In the nitride type compound semiconductor light emitting element, the formation of a mixture having a transparent conductor film applied at the surface of a phosphor layer below the light emitting layer allows the wavelength of the emitted light to be converted into another wavelength by the light emitting element alone. Furthermore, since the phosphor layer is formed in the proximity of the light emitting layer, the wavelength conversion efficiency is further improved.

EXAMPLE 10

Figure 17:
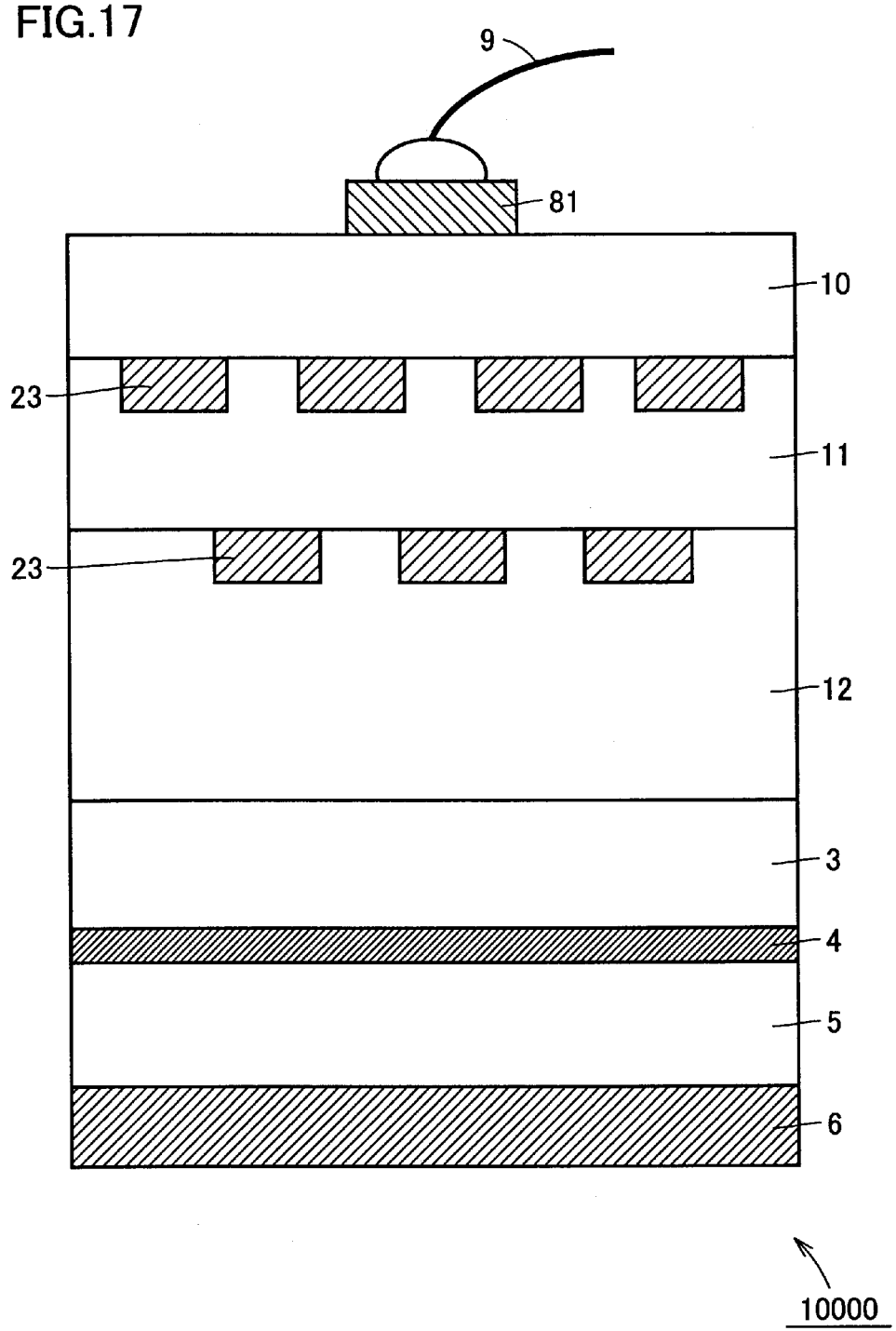
FIG. 17 is a schematic cross sectional view of a nitride gallium type compound semiconductor light emitting element according to a tenth embodiment.
Figure 18:
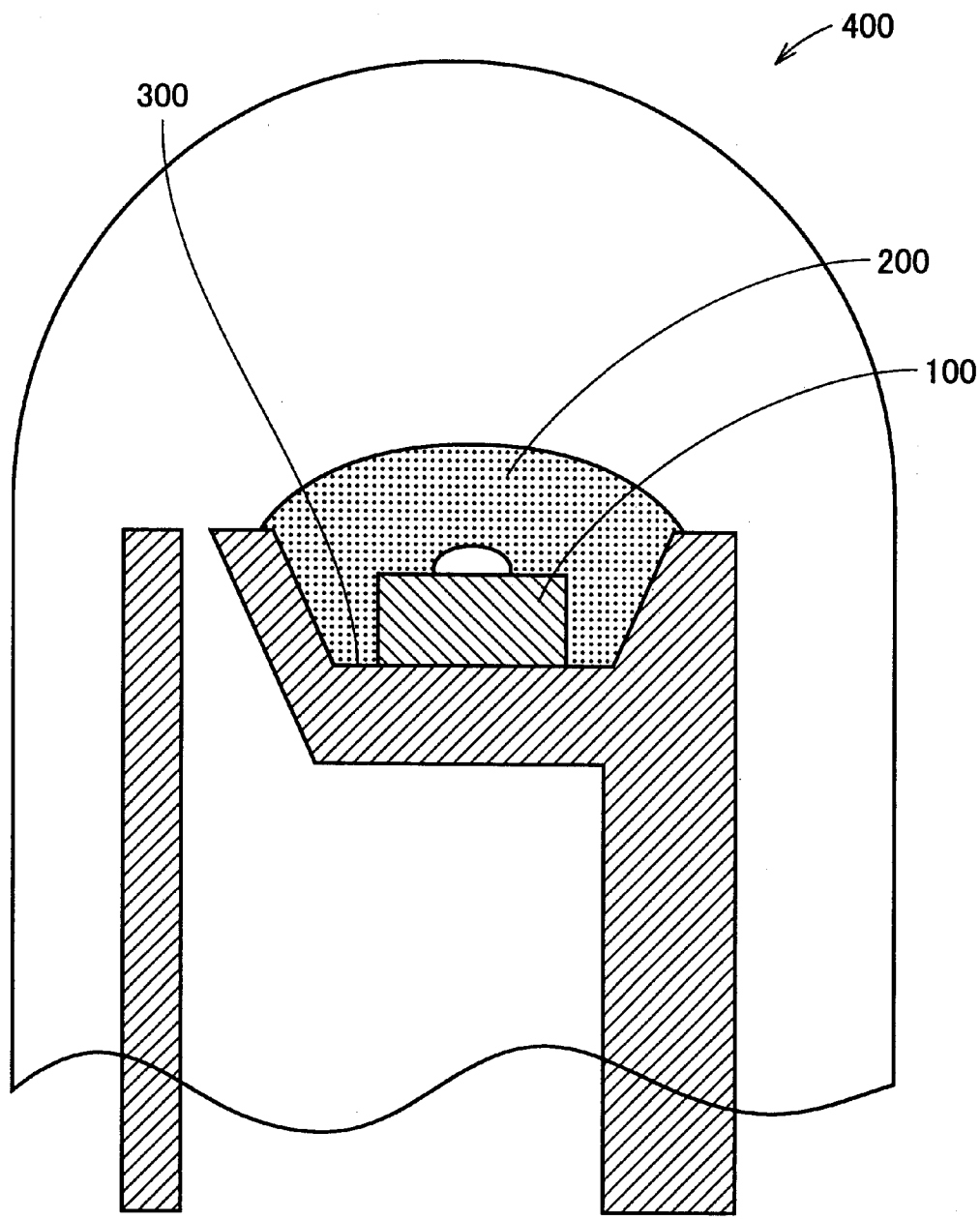
FIG. 18 is a schematic diagram of a conventional nitride gallium type compound semiconductor light emitting element.

FIG. 17 is a schematic diagram of a nitride type compound semiconductor light emitting element fabricated according to another example of the present invention.

An element structure 10,000 of the present invention is similar to the element structure of Example 3. In the present element structure 10,000, a phosphor layer 23 is formed between a GaN substrate 10 and a regrown GaN layer 11. Also, another phosphor layer 23 is formed between regrown GaN layer 11 and regrown GaN layer 12. The phosphor layer is formed into two stages. Element structure 10,000 of the present example is characterized in that these phosphor layers 23 are included in an insulator layer, differing from Example 3.

The fabrication step of the nitride type compound semiconductor light emitting element of the present example will be described in further detail with reference to FIG. 17.

(1) According to a process similar to that of Example 1, a phosphor layer 23 was formed on a GaN substrate 10 (thickness 200 μm). An insulator $SiO_2$ layer was formed so as to cover this phosphor layer 23. This phosphor layer has a width of 50 μm and a thickness of 2.5 μm. The distance between adjacent phosphor layers was 10 μm. A regrown GaN layer 11 was deposited thereon to a thickness of 100 μm. Then, a phosphor layer 23 was formed on regrown GaN layer 11. An insulator $SiO_2$ layer was formed to cover this phosphor layer 23. This phosphor layer had a width of 40 μm and a thickness of 2.5 μm. The distance between adjacent phosphor layers was 10 μm. A GaN layer 12 thereon was grown to a thickness of 150 μm. Materials similar to those of Example 1 can be employed for phosphor layer 23.

(2) An N type nitride gallium type compound semiconductor layer 3, a nitride gallium type compound semiconductor light emitting layer 4, and a P type nitride gallium type compound semiconductor layer 5 were sequentially layered thereon.

(3) Then, a P type thick-film electrode 6 was formed thereon. Here, Pd (thickness 3 nm) and Ag (thickness 1 μm) were provided as P type thick-film electrode 6. An N type pad electrode 81 was formed at the back side of GaN substrate 10. N type pad electrode 81 employed a multilayer structure of Al (thickness 200 nm) and Ti (thickness 10 nm). The GaN substrate 10 wafer was diced into chips of 500 µm square. The P type thick-film electrode 6 side was disposed at the bottom of the cup. An Au wire 9 was connected on N type pad electrode 81 to provide electrical contact with an external source.

Thus, a nitride type compound semiconductor light emitting element that emits white light, superior in light emitting efficiency and mass production, can be fabricated. The wavelength of the emitted light exhibited two peaks of 480 nm and 570 nm. In the nitride type compound semiconductor light emitting element of the present example, the light from the light emitting layer excites the two stages of phosphor layers. Therefore, the wavelength conversion efficiency is improved. By forming a plurality of a stages of the phosphor layer within the substrate, the GaN layer can be regrown over several times. By using the phosphor layer as a selective growth mask, a thick conductive substrate can be formed. The light converted into another wavelength at the insulator layer including the phosphor is emitted outside from the substrate side.

According to the present invention, a phosphor layer is formed in a multilayer that constitutes a light emitting element. Accordingly, a light emitting diode of white light or multicolored light that can convert the wavelength of the emitted light into another wavelength by the light emitting element alone is allowed.

Since a highly-reflective layer is formed at the side plane of the light emitting element, the excited light from the light emitting layer can be introduced efficiently into the phosphor layer. The wavelength of the emitted light can be converted into another wavelength by the light emitting element alone.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride type compound semiconductor light emitting element formed of a multilayer structure including a substrate, a nitride gallium type compound semiconductor layer of a first conductivity type, a nitride gallium type compound semiconductor light emitting layer, and a nitride gallium type compound semiconductor layer of a second conductivity type,
   wherein a phosphor is provided in said multilayer structure or at a portion of said substrate and a transparent conductor film is located on and in contact with a layer including said phosphor.

2. The nitride type compound semiconductor light emitting element according to claim 1, wherein said phosphor is included in an insulator layer.

3. The nitride type compound semiconductor light emitting element according to claim 1, wherein said phosphor functions as a mask to promote lateral growth.

4. The nitride type compound semiconductor light emitting element according to claim 1, wherein said phosphor coated with a transparent conductor film is formed in stripes.

5. The nitride type compound semiconductor light emitting element according to claim 1, wherein said substrate is formed of sapphire, GaN, SiC, ZnO, and Si.

6. The nitride type compound semiconductor light emitting element according to claim 1, wherein said phosphor is formed below the nitride gallium type compound semiconductor light emitting layer.

7. The nitride type compound semiconductor light emitting element according to claim 6, wherein said phosphor is formed in the substrate.

8. The nitride type compound semiconductor light emitting element according to claim 7, wherein light having a wavelength converted at said phosphor is emitted outside from the substrate side.

9. The nitride type compound semiconductor light emitting element according to claim 1, wherein said phosphor is formed at at least two sites in a direction where layers are stacked.

10. The nitride type compound semiconductor light emitting element according to claim 1, wherein said multilayer structure has a highly-reflective layer formed at at least one side plane.

11. The nitride type compound semiconductor light emitting element according to claim 4, wherein said highly-reflective layer and said phosphor in stripes are formed to be orthogonal.

12. The nitride type compound semiconductor light emitting element according to claim 10, wherein said highly-reflective layer is formed also at opposite side planes.

13. The nitride type compound semiconductor light emitting element according to claim 10, wherein said highly-reflective layer is also formed at a bottom plane of the substrate.

14. The nitride type compound semiconductor light emitting element according to claim 1, wherein said phosphor is formed of at least two types of phosphors.

15. The nitride type compound semiconductor light emitting element according to claim 1, wherein said transparent conductor film is formed of one of $In_2O_3$, $SnO_2$, and ZnO or a mixture thereof.

* * * * *